(12) United States Patent
Mori

(10) Patent No.: US 9,691,797 B2
(45) Date of Patent: Jun. 27, 2017

(54) DISPLAY DEVICE

(71) Applicant: Sharp Kabushiki Kaisha, Sakai, Osaka (JP)

(72) Inventor: Takahiro Mori, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/302,215

(22) PCT Filed: Apr. 6, 2015

(86) PCT No.: PCT/JP2015/060744
§ 371 (c)(1),
(2) Date: Oct. 6, 2016

(87) PCT Pub. No.: WO2015/156249
PCT Pub. Date: Oct. 15, 2015

(65) Prior Publication Data
US 2017/0025441 A1 Jan. 26, 2017

(30) Foreign Application Priority Data
Apr. 8, 2014 (JP) .................. 2014-079514

(51) Int. Cl.
*H01L 27/12* (2006.01)
*H01L 27/32* (2006.01)
(Continued)

(52) U.S. Cl.
CPC .......... *H01L 27/124* (2013.01); *G02F 1/1368* (2013.01); *G02F 1/136204* (2013.01);
(Continued)

(58) Field of Classification Search
CPC ............... H01L 27/124; H01L 27/3276; H01L 27/1255; H01L 27/0255; H01L 23/5223; H01L 21/28; H01L 29/786; G02F 1/136204; G02F 1/136286; G02F 1/1368
(Continued)

(56) References Cited

U.S. PATENT DOCUMENTS

2004/0043676 A1* 3/2004 Tada .................. H01L 27/14609
439/894
2005/0259142 A1* 11/2005 Kwak .................. G09G 3/3233
347/238

(Continued)

FOREIGN PATENT DOCUMENTS

JP 2001-318393 A 11/2001

*Primary Examiner* — Dao H Nguyen
(74) *Attorney, Agent, or Firm* — Keating & Bennett, LLP

(57) ABSTRACT

A display device according to one aspect of the present invention includes a plurality of scanning lines (10*a*) and a plurality of signal lines (11*a*); a plurality of pixel thin-film transistors; a common scanning interconnect (10*b*); and a plurality of protective diodes (6) (protective elements). At least a part of a plurality of connecting interconnects that electrically connect the common scanning interconnect with the plurality of protective diodes are constituted by connecting interconnects (11*e*) on the same layer as the signal lines. The surface area of overlapping parts between a plurality of semiconductor layers of thin-film transistors and the scanning lines and the surface area overlapping parts between the plurality of semiconductor layers and the common scanning interconnect are substantially equal.

10 Claims, 14 Drawing Sheets

(51) Int. Cl.
*H01L 23/522* (2006.01)
*G02F 1/1362* (2006.01)
*G02F 1/1368* (2006.01)
*H01L 21/28* (2006.01)
*H01L 29/786* (2006.01)
*H01L 51/50* (2006.01)
*H01L 27/02* (2006.01)

(52) U.S. Cl.
CPC ........ *G02F 1/136286* (2013.01); *H01L 21/28* (2013.01); *H01L 23/5223* (2013.01); *H01L 27/0255* (2013.01); *H01L 27/1255* (2013.01); *H01L 27/3276* (2013.01); *H01L 29/786* (2013.01); *H01L 51/50* (2013.01)

(58) Field of Classification Search
USPC ................ 257/43, 57, 59, 68, 72, 347, 758; 345/76, 80, 89; 365/146; 438/149, 151, 438/238, 239
See application file for complete search history.

(56) References Cited

U.S. PATENT DOCUMENTS

| | | | | |
|---|---|---|---|---|
| 2005/0285830 | A1* | 12/2005 | Iwabuchi | G09G 3/20 345/77 |
| 2007/0030408 | A1* | 2/2007 | Lin | G02F 1/136204 349/40 |
| 2009/0286445 | A1* | 11/2009 | Yamazaki | H01L 27/3276 445/24 |
| 2016/0232864 | A1* | 8/2016 | Fujita | G09G 3/3614 |

* cited by examiner

DISPLAY DEVICE

TECHNICAL FIELD

The present invention relates to a display device.

The subject application claims priority based on the patent application No. 2014-079514 filed in Japan on Apr. 8, 2014 and incorporates by reference herein the content thereof.

BACKGROUND ART

A display device having an active-matrix substrate has been known. In the processing for manufacturing an active-matrix substrate, contacting, friction, and peeling frequently occur between a glass substrate and another material. For that reason, the accumulation of an electrical charge on a semiconductor layer, scanning lines, and signal lines or the like on the glass substrate is unavoidable, and static electricity could break down thin-film transistors (abbreviated TFTs hereinafter) or interconnects.

A method of manufacturing an active-matrix type liquid crystal display device is disclosed in Patent Document 1 noted below as a method of preventing the phenomenon of breakdown caused by this type of static electricity. Patent Document 1 describes a surge protection circuit that prevents breakdown of elements in a liquid crystal panel by the application of a surge voltage.

PRIOR ART DOCUMENTS

Patent Document

[Patent Document 1] Japanese Patent Application Publication No. 2001-318393

SUMMARY OF THE INVENTION

Problem to be Solved by the Invention

However, according to Patent Document 1, until the surge protection circuit is formed, or more specifically until the signal lines and the common signal interconnects are formed, the semiconductor layer, the scanning lines, and the common scanning interconnects formed on the transparent substrate are in the form of independent islands. For that reason, the charge has no path of escape, and is accumulated on these elements. The accumulated charge can cause the phenomenon of breakdown by static electricity. In particular, the breakdown phenomenon caused by static electricity occurring because of accumulated charge on the scanning lines between scanning lines and neighboring interconnects such as common scanning interconnects on the scanning lines accounts for many causes of a decrease in the yield when manufacturing liquid crystal display devices.

One aspect of the present invention has been made to solve the above-noted problem, and has as an object to enable the constitution of a display device capable of suppressing the breakdown phenomenon caused by static electricity occurring before formation of the protective circuit, and in particular the breakdown phenomenon caused by static electricity occurring between scanning lines and neighboring interconnects.

Means for Solving the Problems

To achieve the above-described object, a display device according to one aspect of the present invention comprises: a plurality of scanning lines and a plurality of signal lines that mutually intersect; a plurality of pixel circuit thin-film transistors provided at a plurality of pixels partitioned by the plurality of scanning lines and the plurality of signal lines; a common scanning interconnect that electrically connects between the plurality of scanning lines; and a plurality of protective elements that electrically connect between the common scanning interconnect and each of the plurality of scanning lines. At least a part of the plurality of connecting interconnects that electrically connect the common scanning interconnect with the plurality of protective elements are constituted by interconnects on the same layer as the signal lines. A plurality of pixel circuit semiconductor layers constituting the plurality of pixel circuit thin-film transistors and each of the plurality of scanning lines overlap when seen in plan view. A plurality of semiconductor layers on the same layer as the pixel circuit semiconductor layers and a common interconnect that intersects with the plurality of scanning lines overlap when seen in plan view. The surface area of overlapping parts between the plurality of pixel circuit semiconductor layers and the scanning lines and the surface area overlapping parts between the plurality of semiconductor layers and the common interconnect are substantially equal.

In the display device according to the one aspect of the present invention, the common interconnect may be the common scanning interconnect.

In the display device according to the one aspect of the present invention, a part of the connecting interconnects of the plurality of connecting interconnects may be constituted by interconnects on the same layer as the signal lines. The remaining connecting interconnects of the plurality of connecting interconnects may be constituted by interconnects formed as one with the common scanning interconnect. The plurality of semiconductor layers may be a plurality of first semiconductor layers constituting the plurality of protective elements. The surface area of overlapping parts between the plurality of pixel circuit semiconductor layers and the scanning lines and the surface area overlapping parts between the plurality of first semiconductor layers and the common scanning interconnect may be substantially equal.

In the display device according to the one aspect of the present invention, the plurality of semiconductor layers may be a plurality of second semiconductor layers on the same layer as the pixel circuit semiconductor layers and the protective element first semiconductor layers, all of the plurality of connecting interconnects may be constituted by interconnects on the same layer as the signal lines. The display device may further comprise relay interconnects on the same layer as the signal lines. At least a part of the second semiconductor layers and at least a part of the relay interconnects may overlap with the common scanning interconnect when seen in plan view. The surface area of the overlapping parts between the plurality of pixel circuit semiconductor layers and the scanning lines and the surface of the overlapping parts between the plurality of second semiconductor layers and the common scanning interconnect may be substantially equal. The common scanning interconnect and the second semiconductor layers may be electrically connected via the relay interconnects.

In the display device according to the one aspect of the present invention, a first edge part of the second semiconductor layer may overlap with the common scanning interconnect when seen in plan view. A second edge part of the second semiconductor layer may extend outward toward one side in the width direction of the common scanning interconnect.

In the display device according to the one aspect of the present invention, a center part of the second semiconductor layer may overlap with the common scanning interconnect when seen in plan view. Both edge parts of the second semiconductor layer may extend outward from both sides of the common scanning interconnect in the width direction thereof.

In the display device according to the one aspect of the present invention, the display device may further comprise a supplementary capacitance line constituting a supplementary capacitance. The common interconnect may be the supplementary capacitance line.

In the display device according to the one aspect of the present invention, the plurality of semiconductor layers may be a plurality of second semiconductor layers on the same layer as the pixel circuit semiconductor layers and the protective element first semiconductor layers. All of the plurality of connecting interconnects may be constituted by interconnects on the same layer as the signal lines. The display device may comprise relay interconnects on the same layer as the signal lines. At least a part of the second semiconductor layers and at least a part of the relay interconnects may overlap with the supplementary capacitance line when seen in plan view. The surface area of the overlapping parts between the plurality of pixel circuit semiconductor layers and the scanning lines and the surface of the overlapping parts between the plurality of second semiconductor layers and the supplementary capacitance line may be substantially equal. The supplementary capacitance line and the second semiconductor layers may be electrically connected via the relay interconnects.

In the display device according to the one aspect of the present invention, one of the second semiconductor layers may be provided with respect to each pixel column. A first edge part of the second semiconductor layer may overlap with the supplementary capacitance line when seen in plan view. A second edge part of the second semiconductor layer may extend outward toward one side in the width direction of the supplementary capacitance line.

In the display device according to the one aspect of the present invention, two of the second semiconductor layers may be provided with respect to each pixel column. A first edge part of each of the two second semiconductor layers may overlap with the supplementary capacitance line when seen in plan view. A second edge part of each of the two second semiconductor layers may extend outward from both sides of the supplementary capacitance line in the width direction thereof.

Effect of the Invention

According to one aspect of the present invention, a display device is obtained that enables suppression of the breakdown phenomenon caused by static electricity occurring before formation of the protective circuit, and in particular the breakdown phenomenon caused by static electricity occurring between scanning lines and neighboring interconnects.

BRIEF DESCRIPTIONS OF THE DRAWINGS

Figure 1:
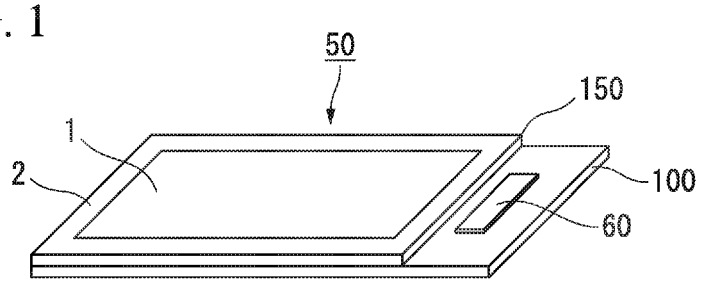
FIG. 1 is an oblique view of an active-matrix type liquid crystal display device.

EMBODIMENTS FOR CARRYING OUT THE INVENTION (First Embodiment)

The first embodiment of the present invention is described below, with references made to FIG. 1 to FIG. 6.

In the present embodiment, a liquid crystal display device having an active-matrix substrate is given as an example of a display device.

In the drawings noted below, in order to make the various constituent elements easier to see, the dimensional proportions are different in some cases.

(Basic Constitution of the Embodiment)

FIG. 1 is an oblique view of an active-matrix type liquid crystal display device.

As shown in FIG. 1, the liquid crystal display device 50 has, for example, an active-matrix substrate 100 and an opposing substrate 150, provided so as to oppose each other, and a liquid crystal layer (not shown) sandwiched between the active-matrix substrate 100 and the opposing substrate 150. The liquid crystal display device 50 is provided with display region 1, which displays an image, and a frame region 2 that surrounds the display region 1.

Figure 2:
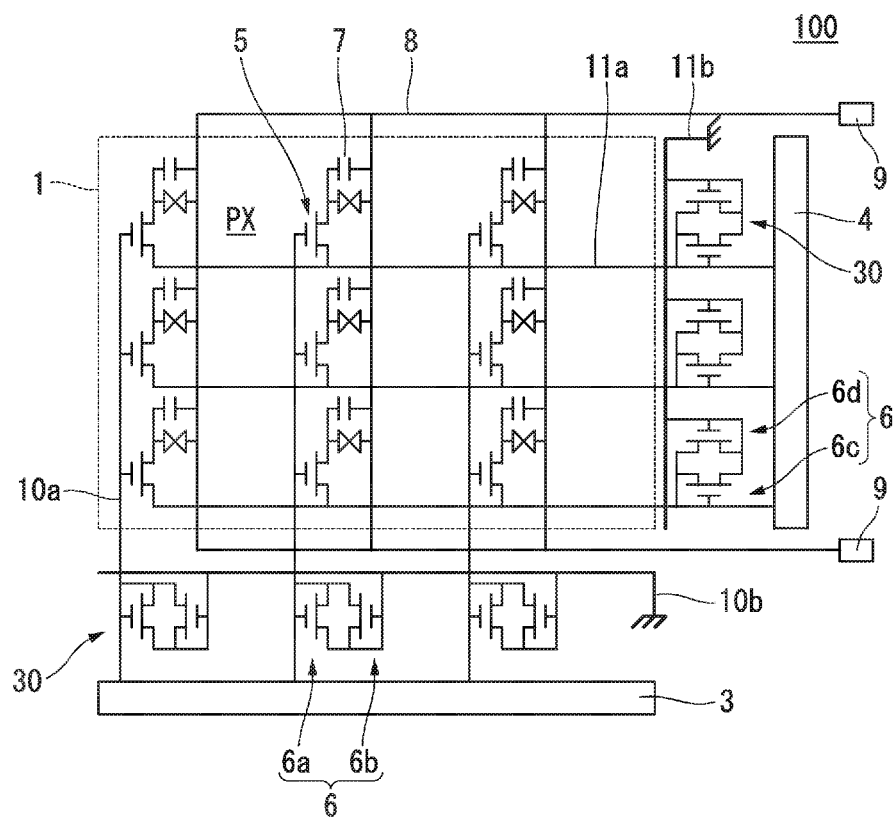
FIG. 2 is a circuit diagram of an active-matrix type liquid crystal display device.

FIG. 2 is a circuit diagram of the liquid crystal display device 50.

As shown in FIG. 2, the active-matrix substrate 100, for example, in the rectangular display region 1, a plurality of scanning lines 10*a*, which extend in parallel with each other, and a plurality of signal lines 11*a* that extend in parallel with each other in a direction that is perpendicular to the scanning lines 10*a*.

In the display region 1, pixels PX are formed in regions formed by neighboring scanning lines 10a and neighboring signal lines 11a. A supplementary capacitance 7 and a pixel TFT 5 for the purpose of switching are provided inside of a pixel PX. The supplementary capacitance 7 is connected to a terminal 9 via a supplementary capacitance line 8. When the liquid crystal display device 50 is driven, a voltage is applied from outside to one electrode of the supplementary capacitance 7, via the terminal 9 and the supplementary capacitance line 8.

A scanning drive circuit 3 is disposed on the outside (lower side in FIG. 2) of the display region 1. A signal drive circuit 4 is disposed on the outside (right side in FIG. 2) of the display region 1. The scanning drive circuit 3 is formed directly over the active-matrix substrate 100. The signal drive circuit 4 is incorporated into an IC driver 60 mounted over the active-matrix substrate 100, as shown in FIG. 1.

If a charge accumulates on, for example, the scanning lines 10a or the signal lines 11a, that charge might destroy a TFT or an interconnect. In this case, the liquid crystal display device 50 will fail.

Given this, to prevent destruction of a TFT or interconnect, the active-matrix substrate 100 has a protective circuit 30 as described below.

A common scanning interconnect 10b and a common signal interconnect 11b are provided in the periphery of the display region 1. The common scanning interconnect 10b makes electrical connection between a plurality of scanning lines 10a. The common signal interconnect 11b makes electrical connection between a plurality of scanning lines 11a. Protective diodes 6 are provided between the scanning line 10a and the common scanning interconnect 10b and between the signal lines 11a and the common signal interconnect 11b. One end of the common scanning interconnect 10b and one end of the common signal interconnect 11b are connected to ground. If a scanning line 10a or a signal line 11a is at a high voltage because of an accumulated charge, the protective diode 6 discharges the charge, enabling the accumulated charge to escape to the common scanning interconnect 10b or the common signal interconnect 11b, thereby protecting a TFT or an interconnect.

The "protective diode 6" in the present embodiment corresponds to the "protective element" in the claims.

A protective diode 6 is formed by shorting to its own drain or source the gates of the protective TFTs 6a, 6b, 6c, and 6d, which are manufactured in the same process in which the pixel TFT 5 is formed in the display region 1. In FIG. 2, the gate of the protective TFT 6a is connected to the scanning line 10a, and the gate of the protective TFT 6c is connected to the signal line 11a. The gate of the protective TFT 6b is connected to the common scanning interconnect 10b and the gate of the protective TFT 6d is connected to the common signal interconnect 11b. The reason that protective TFTs 6a, 6b, 6c, and 6d of different orientations are disposed between scanning lines 10a and the common scanning interconnect 10b or the signal lines 11a and the common signal interconnect 11b is because of the need to accommodate both positive-voltage and negative-voltage static electricity.

Figure 3:
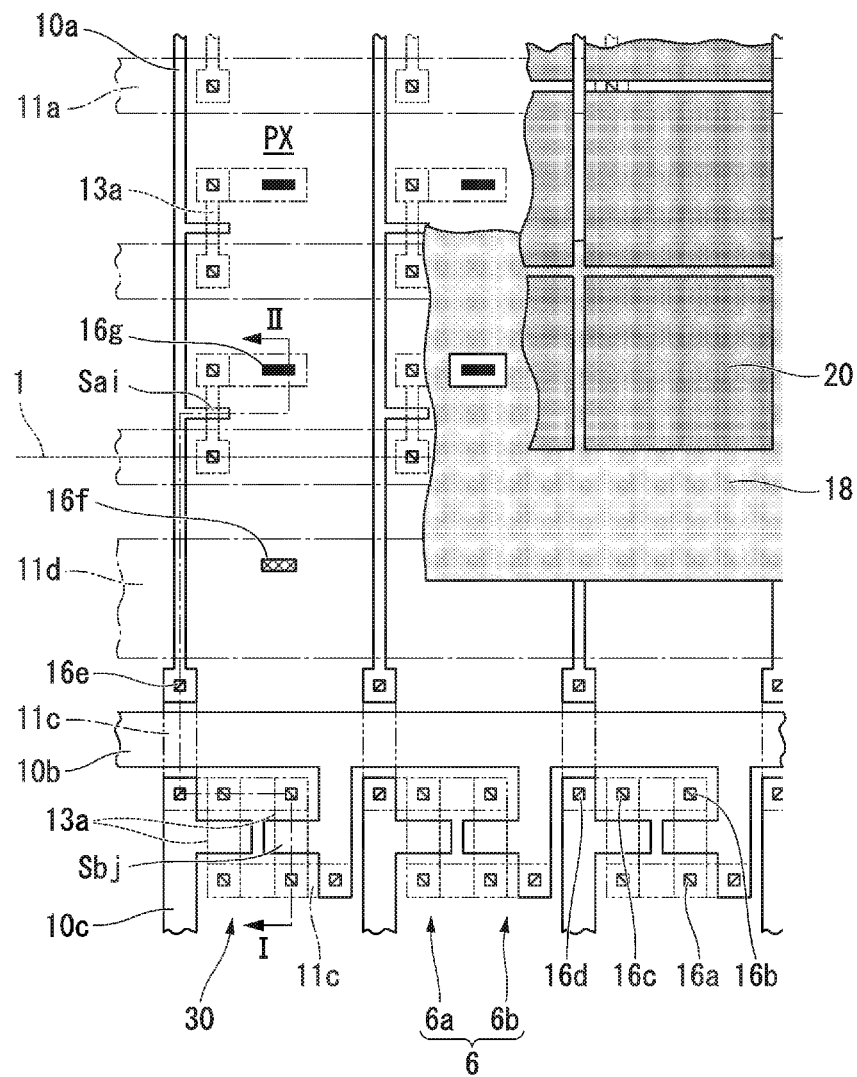
FIG. 3 is a plan view of an active-matrix substrate, showing the layout of a protective circuit in a comparison example.

FIG. 3 is a plan view showing the layout of the protective TFTs 6a, 6b, and the like in a comparison example.

Figure 4A:
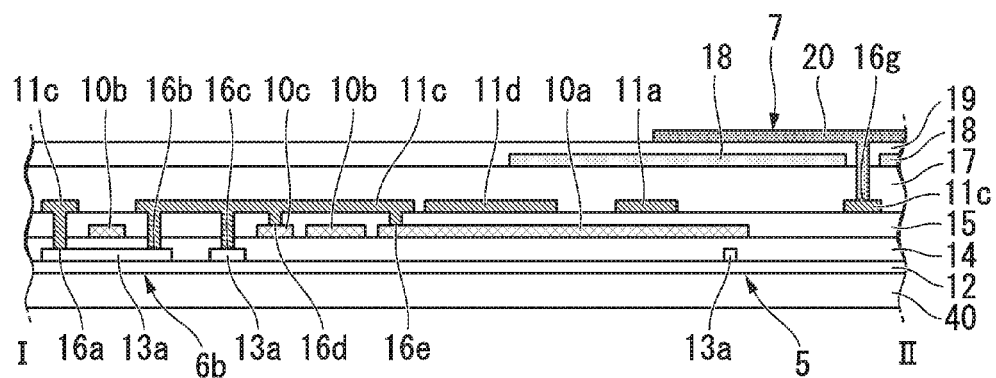
FIG. 4A is a first cross-sectional view along the line I-II in FIG. 3.

FIG. 4A is a cross-sectional view along the line I-II in FIG. 3.

FIG. 3 and FIG. 4A show a top-gate TFT, which is a TFT in which a scanning line 10a is disposed on the upper layer side (upper direction in FIG. 4A) of the semiconductor layer 13a.

The method of manufacturing the active-matrix substrate 100 will be described below, with references made to FIG. 3 and FIG. 4A.

(Method for Manufacturing the Active-Matrix Substrate)

First, CVD (chemical vapor deposition) for example is used to form an underfilm 12 by depositing a silicon nitride film, a silicon oxide film, or a laminate of these films to a thickness of approximately 50 nm on a transparent substrate 40 made of a glass substrate or the like.

Then, for example, CVD is used to deposit an intrinsic amorphous silicon film to a thickness of approximately 50 nm onto the overall substrate, onto which the underfilm 12 had been formed. After that, the intrinsic amorphous film is made polycrystalline by annealing using laser light or the like, thereby forming a polysilicon film. That polysilicon film is subjected to photolithography, etching, and resist peeling to form the semiconductor layer 13a and the like.

After that, for example, CVD is used to form an inorganic insulating film made of silicon nitride, silicon oxide or a laminate of these films to a thickness of approximately 100 nm over the entire substrate, onto which the semiconductor layer 13a had been formed, thereby forming a gate insulating film 14.

Additionally, a metal film of a tungsten film or the like is formed by sputtering to a thickness of approximately 300 nm over the entire substrate, onto which the gate insulating film 14 had been formed. After that, the metal film is subjected to photolithography, etching, and resist peeling, thereby forming the scanning lines 10a, the common scanning interconnect 10b, the other gate line 10c, and the like.

Then, using the scanning lines 10a as a mask, an impurity such as phosphorus is implanted into the semiconductor layer 13a on the substrate, thereby forming a channel region, a source region, a drain region in the semiconductor layer 13a, and the like.

Additionally, CVD is used to form an inorganic insulating film made of silicon nitride, silicon oxide, or a laminate of these films to a thickness of approximately 700 nm over the entire substrate, on which the channel region, the source region, and the drain region of the semiconductor layer 13a are formed. After that, the inorganic insulating film and the gate insulating film 14 are subjected to photolithography, etching, and resist peeling, thereby forming an interlayer insulating film 15 having contact holes 16a, 16b, 16c, 16d, 16e, and the like.

After that, for example, sputtering is used to form a metal film of an aluminum film or the like to a thickness of approximately 350 nm over the entire substrate, onto which the interlayer insulating film 15 had been formed. After that, that metal film is subjected to photolithography, etching, and resist peeling, thereby forming the signal lines 11a, the common signal interconnect 11b, the other source interconnects 11c and a supplementary capacitance line 11d and the like. This forms the protective circuit 30, which includes the scanning drive circuit 3, the pixel TFTs 5, and the protective TFTs 6a, 6b, 6c, and 6d.

Additionally, spin coating or slit coating is used to coat a photosensitive acrylic resin film to a thickness of approximately 2 μm over the entire substrate, onto which the signal lines 11a and the like had been formed. After that, the coated film is subjected to pre-baking, exposure, development, and post-baking, thereby forming a protective insulating film 17 that has the contact hole 16f and the like.

After that, for example, sputtering is used to form a transparent conductive film made of an ITO (indium tin oxide) film or the like to a thickness of approximately 100 nm over the entire substrate, on which the protective insulating film 17 had been formed. After that, the transparent protective film is subjected to photolithography, etching, and resist peeling, thereby forming the common electrode 18 and a part of the supplementary capacitance 7.

Additionally, for example, CVD is used to form an inorganic insulating film made of silicon nitride, silicon oxide, or a laminate of these films to a thickness of approximately 200 nm over the entire substrate, onto which the common electrode 18 had been formed. After that, the inorganic insulating film is subjected to photolithography, etching, and resist peeling, thereby forming an interlayer insulating film 19 having the contact holes 16g and the like.

After that, for example, sputtering is used to form a transparent conductive film of ITO film or the like to a thickness of approximately 100 nm over the entire substrate, onto which the interlayer insulating film 19 had been formed. After that, the transparent conductive film is subjected to photolithography, etching, and resist peeling, thereby forming the pixel electrodes 20 and a part of the supplementary capacitance 7.

After that, for example, spin coating, slit coating, or printing is used to coat a polyimide resin film over the entire substrate onto which the pixel electrodes 20 and the like had been formed, after which the coated film is baked and rubbed to form an oriented film (not shown).

The above process steps can be done to manufacture the active-matrix substrate 100.

(Manufacturing Process for the Opposing Substrate)

First, for example, spin coating or slit coating is used to coat a black-colored photosensitive resin onto an entire transparent substrate made of a glass substrate or the like. After that, by exposing and developing the coated film, a black matrix having a thickness of approximately 1 µm is formed.

Then, spin coating or slit coating is used to coat photosensitive resins that are colored read, green, or blue over the entire substrate, onto which the black matrix had been formed. After that, by exposing and developing the coated film, a colored layer (for example, a red layer) of a selected color is formed to a thickness of approximately 1 µm to 3 µm. Then, the same process steps are repeated for the other two colors, thereby forming colored layers (for example, a green layer and a blue layer) of the other two colors to a thickness of approximately 1 µm to 3 µm.

Additionally, for example, spin coating or slit coating is used to coat a photosensitive acrylic resin film to a thickness of approximately 4 µm on the entire substrate, onto which the colored layers have been formed. After that, the coated film is subjected to pre-baking, exposure, development, and post-baking, thereby forming photospacers for maintaining a gap between the active-matrix substrate 100 and the opposing substrate 150.

Finally, for example, spin coating, slit coating, or printing is used to coat a polyimide resin film over the entire substrate, onto which the photospacers had been formed. After that, the coated film is baked and rubbed to form an oriented film.

The above process steps can be used to manufacture the opposing substrate 150.

(Liquid Crystal Injection Process Step)

For example, a frame of sealing material made from a combined UV (ultraviolet)-cured/thermosetting resin is printed on the surface of the opposing substrate 150 manufactured by the above-noted opposing substrate manufacturing process, after which the liquid crystal material is dripped into the inside of the sealing material.

Then, the opposing substrate 150 onto which the liquid crystal material had been dripped and the above-noted active-matrix substrate 100 that had been manufactured by the above-noted active-matrix substrate manufacturing process step are brought together in a reduced-pressure atmosphere, after which they are exposed to atmospheric pressure.

Additionally, after exposing the sealing material to UV light with the substrates brought together, they are heated to cure the sealing material.

Finally, for example, the base material is divided by dicing, and the unwanted parts of the active-matrix substrate 100 and the opposing substrate 150 are removed.

The above process steps can be used to manufacture the active-matrix type liquid crystal display device 50 shown in FIG. 1.

(Causes of and Countermeasures for Breakdown Caused by Static Electricity)

As described above, for example, in the photolithography done in the process for manufacturing the active-matrix substrate 100, contact, friction, peeling and the like frequently occurs between the glass substrate and other materials. For that reason, the accumulation of an electrical charge on a semiconductor layer 13a, scanning lines 10a, and signal lines 11a or the like is unavoidable. In this case, as described before, static electricity could break down TFTs or interconnects.

With the constitution of the protective circuit 30 in the comparison example such as shown in FIG. 3, however, until the protection circuit 30 is formed, or more specifically until the signal lines 11a and the common signal interconnects 11b are formed, the semiconductor layer 13a, the scanning lines 10a, and the common scanning interconnects 10b formed on the transparent substrate 40 are in the form of independent islands. For that reason, the accumulation of an electrical charge is unavoidable, and electrical charge accumulates on these elements. As a result, the phenomenon of breakdown by static electricity can occur. In particular, the breakdown phenomenon caused by static electricity occurring because of charge accumulated of the scanning line 10a between the scanning lines 10a and neighboring interconnects, such as the scanning lines 10a and the common scanning interconnect 10b accounts for many causes of a decrease in the yield when manufacturing the active matrix substrate 100.

A cause of charge accumulating on the scanning lines 10a, the common scanning interconnect 10b, and the like, in addition to a charge being directly accumulated in the scanning lines 10a, the common scanning interconnect 10b and the like, is electrostatic induction into the scanning lines 10a, the common scanning interconnect 10b and the like induced by a charge accumulated in conductors and semiconductors that overlap with the scanning lines 10a and the common scanning interconnect 10b when seen in plan view.

Figure 4B:
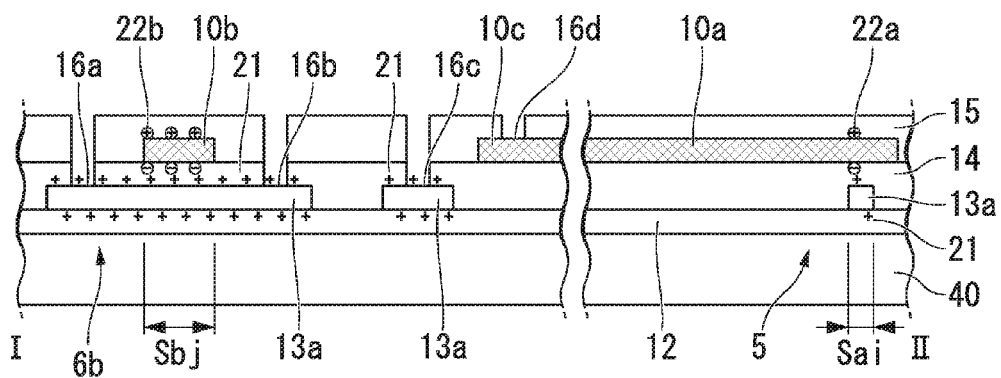
FIG. 4B is a second cross-sectional view along the line I-II line in FIG. 3.

Electrostatic induction into the scanning lines 10a, the common scanning interconnect 10b and the like will be described below, using FIG. 4B. FIG. 4B is an enlarged cross-sectional view of the vicinity of the pixel TFT 5 and the protective TFT 6b of FIG. 4A and a cross-sectional view of the active-matrix substrate 100 at the point in time at which a interlayer insulating film 15 having the contact holes 16a, 16b, and the like was formed therein.

For example, as shown in FIG. 4B, if the charge 21 that is the charge amount per unit surface area q $[C/\mu m2]$ is accumulated on the semiconductor layer 13a that is one independent island, that is, on each semiconductor layer 13a, which is at a floating potential, a charge of the amount expressed by Equation 1 is accumulated on the overall surface (upward in the drawing) of the semiconductor layer 13a of the pixel TFT 5 that overlaps with the scanning line 10a that is one independent island, when seen in plan view.

$$q \times Sai[C](i=1,2,\ldots,m) \qquad \text{(Equation 1)}$$

In the same manner, a charge of the amount expressed by Equation 2 is accumulated on the overall surface (upward in the drawing) of the semiconductor layer 13a of the protective TFT 6b that overlaps with common scanning interconnect 10b that is one independent island, when seen in plan view.

$$q \times Sbj[C](j=1,2,\ldots,n) \qquad \text{(Equation 2)}$$

The term Sai [$\mu m^2$] is the surface area of the semiconductor layer 13a of the i-th pixel TFT 5 overlapping a scanning line 10a that is one independent island, when seen in plan view. The term Sbj [$\mu m^2$] is the surface area of a semiconductor layer 13a of the j-th protective TFT 6b overlapping the common scanning interconnect 10b that is one independent island when seen in plan view. The term m [quantity] is the number of pixel TFTs 5 electrically connected to a scanning line 10a that is one independent island. The term n [quantity] is the number of protective TFTs 6 electrically connected to the common scanning interconnect 10b that is an independent island.

It can been thought that, because of electrostatic induction of these charges, a charge 22a of the charge amount Qa, expressed by Equation 3, by Equation 1, is apparently stored on the entire surface (above the drawing surface) of the scanning line 10a that is one independent island.

$$Qa \approx \Sigma(q \times Sai) = q \times \Sigma Sai[C](i=1,2,\ldots,m) \qquad \text{(Equation 3)}$$

In contrast, a charge 22b of the charge amount Qb, expressed by Equation 4, from Equation 2, is apparently stored on entire surface (above the drawing surface) of the common scanning interconnect 10b that is one independent island.

$$Qb \approx \Sigma(q \times Sbj) = q \times \Sigma Sbj[C](j=1,2,\ldots,n) \qquad \text{(Equation 4)}$$

From the above, the difference ΔQ in the amount of charge between the scanning line 10a that is one independent island and the common scanning interconnect 10b that is one independent island, from Equation 3 and Equation 4, is as follows.

$$\Delta Q \approx |Qa - Qb| = q \times |\Sigma Sai - \Sigma Sbj|$$

When this is done, if the ΔQ is excessively large, it can be through that the phenomenon of breakdown due to static electricity will occur.

In this case, if there is no difference in charge amount between the scanning line 10a that is one independent island and the common scanning interconnect 10b that is one independent island, that is, if ΔQ=0, the following is obtained.

$$\Sigma Sai = \Sigma Sbj (i=1,2,\ldots,m)(j=1,2,\ldots,n) \qquad \text{(Equation 5)}$$

Stated differently, when seen in plan view, if the surface area of the semiconductor layers 13a overlapping with the scanning line 10a that is one independent island and when seen in plan view, the surface area of the entire semiconductor layer 13a overlapping with the common scanning interconnect 10b that is one independent island can be made to be the same value as much as possible, it is possible to make the difference ΔQ of the charge amount causes by electrostatic induction as small as possible. As a result it can be thought that it is possible to suppress the phenomenon of breakdown caused by static electricity.

In recent years, in order to satisfy demands for high definition, there have been demands for active-matrix type liquid crystal display devices with smaller pixel regions, for example, with scanning lines 10a themselves made a smaller surface area. It has also become necessary meet demands for frame narrowing, by reducing the size of the frame region, such as reducing the surface area of the common scanning interconnect 10b itself and the supplementary capacitance lines 11d themselves. Because of this, the proportion of surface area of overlapping between the scanning lines 10a and the common signal interconnect 10b and the like and the semiconductor layer 13a tends to increase, to the extent that the charge attributed to electrostatic induction can no longer be ignored.

Specific constitutions for implementing methods for solving the above problems in the various embodiments are described below.

(First Embodiment)

A liquid crystal display device of the first embodiment is described below, using FIG. 5 and FIG. 6.

Although the basic constitution of the liquid crystal display device of the first embodiment is as described using FIG. 3, FIG. 4A, and FIG. 4B, the constitution regarding the protective circuit is different from FIG. 3, FIG. 4A, and FIG. 4B.

Figure 5:
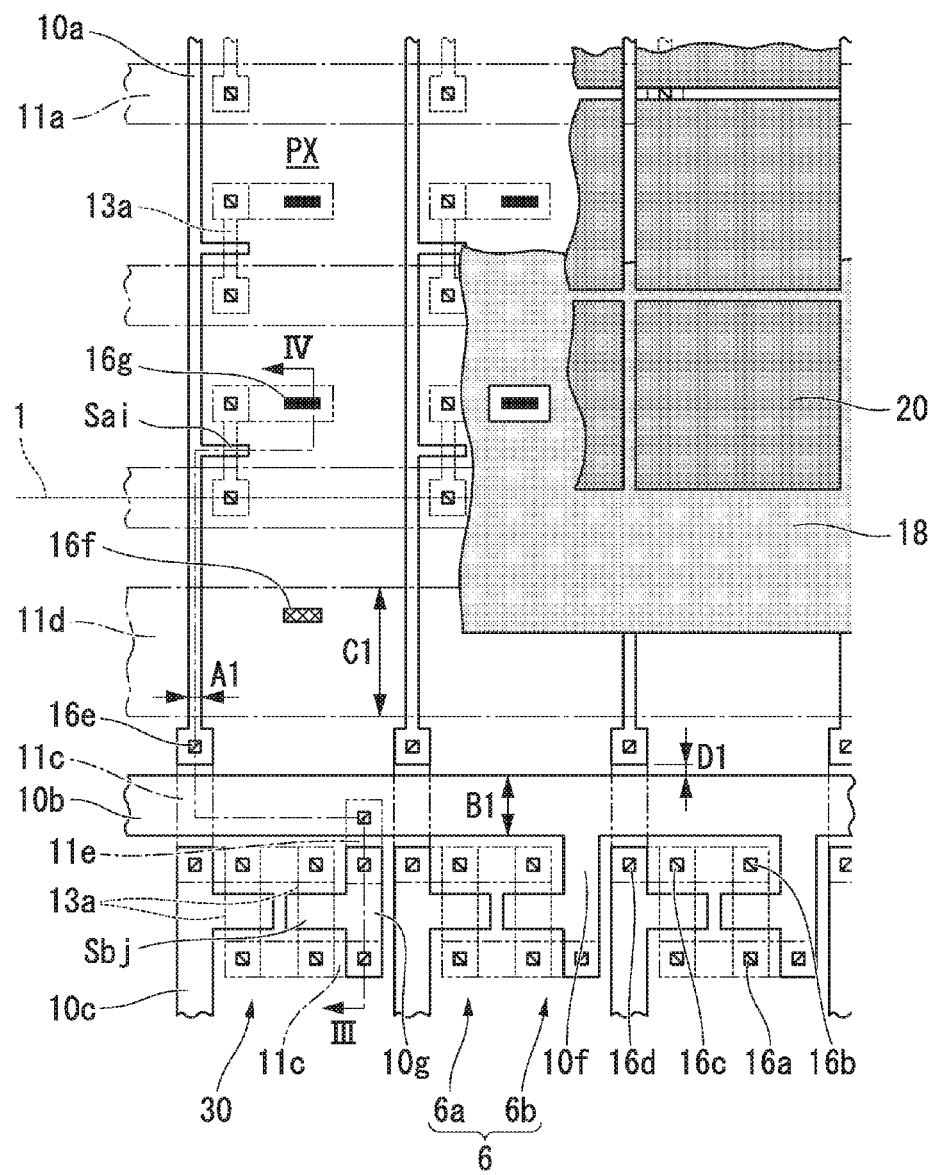
FIG. 5 is a plan view of an active-matrix substrate, showing the layout of a protective circuit of a first embodiment.
Figure 6:
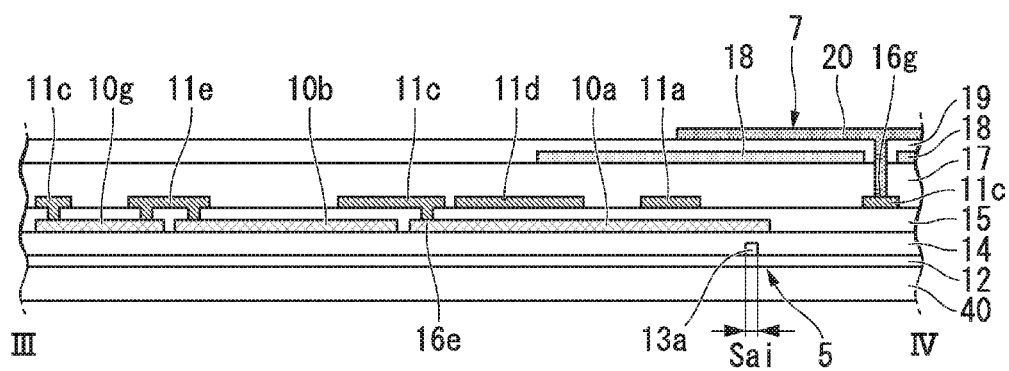
FIG. 6 is a cross-sectional view along the line III-IV in FIG. 5.

In FIG. 5 and FIG. 6, constituent elements that are the same as those in FIG. 3, FIG. 4A, and FIG. 4B used in the description of the basic constitution are assigned the same reference symbols, and the detail description thereof will be omitted.

FIG. 5 is a plan view of an active-matrix substrate 200, showing the layout of the protective circuit of the first embodiment.

The point of difference in FIG. 5 with respect to FIG. 3 is that connecting interconnects 11e constituted on the same layer as the signal lines 11a are used as a part of the connecting interconnects of a plurality of connecting interconnects electrically connecting the common scanning interconnect 10b and the protective TFTs 6b constituting the protective diodes 6.

FIG. 6 is a cross-sectional view along the line III-IV of FIG. 5.

As shown in FIG. 6, the connecting interconnect 11e that electrically connects the common scanning interconnect 10b and the gate 10g of the protective TFT 6b is constituted on the same layer as the signal line 11a. In this manner, a part of the connecting interconnects 11e of the plurality of connecting interconnects electrically connecting the common scanning interconnect 10b and the protective TFT 6b is constituted by an interconnect on the same layer as the signal lines 11a. The remaining connecting interconnects 10f of the plurality of connecting interconnects, similar to the comparison example shown in FIG. 3, is constituted as one with the common scanning interconnect 10b. For example, FIG. 5 shows three protective diodes 6, the connecting interconnect 11e of the left edge protective diode 6 being constituted by an interconnect on the same layer as the signal lines 11a. The connecting interconnects 10f of the center and the right-edge protective diodes 6 are constituted as an interconnect as one with the common scanning interconnect 10b.

By doing this, until the protective circuit 30 formed, the number of pixel TFTs 6b electrically connected to the common scanning interconnect 10b that is one independent island, thereby enabling suppression of the phenomenon of breakdown by static electricity between the scanning lines 10a and neighboring interconnects, which in this case is the common signal interconnect 10b.

More specifically, with respect to the present embodiment, the Sai [μm²] on the left side of Equation 5 is a value regarding the semiconductor layer 13a of the i-th pixel TFT 5. Because this value is established by constraints imposed by the performance of the pixel TFT 5 the manufacturing process and the like, it is the same value for all pixel TFTs 5.

Let this value be Sa [μm²]. The Sbj [μm²] on the right side of Equation 5 is a value regarding the semiconductor layer 13a of the j-th protective TFT 6b. Because this value is constrained by the performance of the protective TFTs 6b and the manufacturing process and the like, it is the same value for all the protective TFTs 6b. Let this value be Sb [μm²]. The m [quantity] in Equation 5 represents the number of pixel TFTs 5 electrically connected to a scanning line 10a that is one independent island. The term n [quantity] represents the number of protective TFTs 6b electrically connected to a common scanning interconnect 10b that is one independent island before formation of the protective circuit, specifically, before the formation of the scanning line 11a.

However, with regard to the n [quantity], adjustment can be done by how many connecting interconnects 11e on the same layer as the signal line 11a are used as connecting interconnects from among the plurality of connecting interconnects electrically connecting common scanning interconnect 10b and the protective TFT 6b that are independent islands, such as in the present embodiment. That is, it is sufficient that the surface area of the overlapping part between the semiconductor layer 13a of a plurality of pixel TFTs 5 and the scanning lines 10a the surface area of the overlapping part between the semiconductor layer 13a of the pixel TFTs 6b electrically connected to the common scanning interconnect 10b by the connecting interconnect 10f and the common scanning interconnect 10b be made substantially the same. If the adjusted value is n' [quantity], from Equation 5 we have the following.

$$\Sigma Sai = \Sigma Sbj (i=1,2,\ldots,m)(j=1,2,\ldots,n')$$

$$\rightarrow m \times Sa = n' \times Sb$$

$$\rightarrow n' = (m \times Sa)/Sb [\text{quantity}] \quad \text{(Equation 6)}$$

For example, if the size display region for image display is 6.95 inches and the image resolution is WXGA, Sa=52.25 [μm²], Sb=244 [μm²], and m=2400 [quantity].

From Equation 6, we have the following.

$$n' = (2400 \times 52.25)/244 \approx 513.9 [\text{quantity}]$$

Therefore, until the protective circuit 30 is formed, the number of protective TFTs 6b electrically connected to the common scanning interconnect 10b that is one independent island can be made 514 [quantity], as the value that minimizes the value of ΔQ.

The number of protective TFTs 6b electrically connected to the common scanning interconnect 10b that is one independent island is optimally made 514, but it is not necessarily 514 [quantity]. For example, the value can be made approximately 412 to 616.

The reason for this is as follows.

If the gate capacitance of a pixel TFT 5 is Cg and the breakdown voltage of the gate insulating film 14 of the pixel TFT 5 is Vg (>0), the amount of charge Qg at which the gate insulating film 14 of the pixel TFT 5 will break down is given by Equation 7.

$$Qg = Cg \times Vg [C] \quad \text{(Equation 7)}$$

Thus, the difference ΔQg of the amount of charge at which the gate insulating film 14 of the pixel TFT 5 will break down is given by Equation 8.

$$\Delta Qg = 2 \times Qg = 2 \times Cg \times Vg [C] \quad \text{(Equation 8)}$$

From Equation 3, the charge 21 of the charge amount qg [C/μm²] per unit surface area at which the gate insulating film 14 of the pixel TFT 5 will break down is given by Equation 9.

$$\Delta Qg \approx \Sigma(qg \times Sai) = qg \times \Sigma Sai [C] (i=1,2,\ldots,m)$$

$$\rightarrow qg = \Delta Qg / \Sigma Sai [C/\mu m^2] \quad \text{(Equation 9)}$$

Therefore, when the qg value is exceeded the breakdown of the gate insulating film 14 of the pixel TFT 5 is unavoidable, because of the intrinsic characteristics of the material.

In contrast, if the interlayer capacitance is Ci and the breakdown voltage of the interlayer insulating film 15 is Vi(>0), the amount of charge Qi at which the interlayer insulating film 15, which is the spacing D1 between the scanning line 10a and an neighboring interconnect, which in this case is the common scanning interconnect 10b, will break down is given by Equation 10.

$$Qi = Ci \times Vi [C] \quad \text{(Equation 10)}$$

Therefore, the charge different ΔQ at which the interlayer insulating film 15, which is the spacing D1 between the scanning line 10a and an neighboring interconnect, which in this case is the common scanning interconnect 10b, will break down is given by Equation 11.

$$\Delta Qi = 2 \times Qi = 2 \times Ci \times Vi [C] \quad \text{(Equation 11)}$$

Therefore, the maximum value of the difference |ΣSai−ΣSbj| between the surface areas when, because of the intrinsic characteristics of the material the gate insulating film 14 of the pixel TFT 5 breaks down and also the interlayer insulating film 15 of the spacing D1 between the scanning line 10a and a neighboring interconnect, which in this case is the common scanning interconnect 10b, from Equation 9, is given by Equation 12.

$$\Delta Qi = qg \times |\Sigma Sai - \Sigma Sbj|$$

$$\rightarrow |\Sigma Sai - \Sigma Sbj| = \Delta Qi/qg = (\Delta Qi \times \Sigma Sai)/\Delta Qg \quad \text{(Equation 12)}$$

Stated differently, if a value greater than this is used, the interlayer insulating film 15 between the scanning line 10a and a neighboring interconnect, which in this case is the common scanning interconnect 10b, will break down before the gate insulating film 14 of the pixel TFT 5, the effect of the present invention becoming extremely small.

For example, as described above, if the size display region for image display is 6.95 inches and the image resolution is WXGA, because Cg=2.00E-14 [F] and Vg=100 [V], from Equation 8 we have the following.

$$\Delta Qg = 2 \times Cg \times Vg = 4.00 \times 10^{-12} [C]$$

From Equation 9, we have the following.

$$qg = \Delta Qg/\Sigma Sai \approx 3.20 \times 10^{-17} [C/\mu m^2]$$

Because Ci=4.00×10⁻¹⁷ [F] and Vi=10 [kV], from Equation 11), we have the following.

$$\Delta Qi = 2 \times Ci \times Vi = 8.00 \times 10^{-13} [C]$$

From Equation 12, we have the following.

$$|\Sigma Sai - \Sigma Sbj| = (\Delta Qi \times \Sigma Sai)/\Delta Qg \approx 2.50 \times 10^4 [\mu m^2]$$

As described above, as long as $$|\Sigma Sai - \Sigma Sbj| = |m \times Sa - n' \times Sb| < 2.50 \times 10^4 \quad \text{(Equation 13)}$$

is satisfied, from m=2400 [quantity], Sa=52.25 [μm²], and Sb=244 [μm²], we have the following.

411.5<n'<616.4

Thus, as described above, the number of protective TFTs 6b may be may a value from approximately 412 to 616.

The value of n before adjustment, as can be seen in FIG. 3, is equal to the number of scanning lines 10a, this being 1280 [quantity]. In the present embodiment, the proportion of the connecting interconnects 11e used as a part of the plurality of connecting interconnects electrically connecting the common scanning interconnect 10b that is one independent island with a protective TFT 6b is set to approximately three out of five lines. The reasons for setting the proportion in this manner is to suppress the phenomenon of breakdown by localized static electricity by avoiding localized accumulation of charge, when the overall surface of the common scanning interconnect 10b that is one independent island is viewed, caused by electrostatic induction. Setting in this manner is preferable.

The interconnect width A1 of a scanning line 10a that is one independent island is set to 25 [μm], the length thereof is set to 94,000 [μm], the interconnect width B1 of a common scanning interconnect 10b that is one independent island is set to 15 [μm] and the length thereof is set to 150,000 [μm]. These values are set so that the surface area of a scanning line 10a that is one independent island and the surface area of the common scanning interconnect 10b that is one independent island are substantially equal, and to make the amount of charge directly accumulated on each the same as much as possible.

Specifically, it is preferable that the ratio of the surface area of a common scanning interconnect 10b that is one independent island to the surface area of a scanning line 10a that is one independent island is in the range from +0.8 to +1.2.

The interconnect width C1 of the supplementary capacitance line 11d is set to 220 [μm] and the spacing D1 between the scanning lines 10a and the common scanning interconnect 10b is set to 10 [μm].

Naturally, after formation of the protective circuit 30, if a high voltage exists on a scanning line 10a or the signal line 11a due to an accumulated charge, the protective TFT 6a or the protective TFT 6b discharges, the electrical charge escaping to the common scanning interconnect 10b or the common signal interconnect 11b, enabling prevention of the breakdown phenomenon caused by static electricity.

(Second Embodiment)

A liquid crystal display device of the second embodiment will now be described, using FIG. 7 and FIG. 8.

Although the basic constitution of the liquid crystal display device of the second embodiment is as described using FIG. 3, FIG. 4A, and FIG. 4B, the constitution regarding the protective circuit is different from FIG. 3, FIG. 4A, and FIG. 4B.

Figure 7:
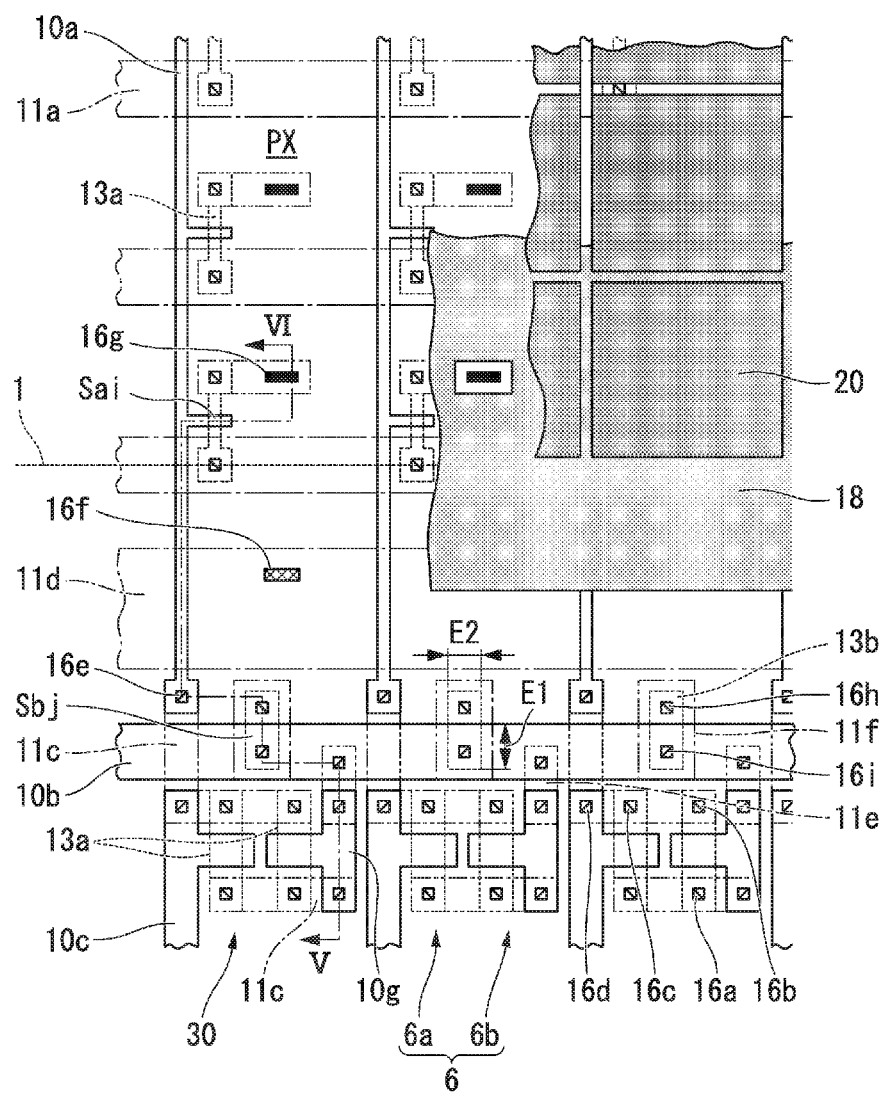
FIG. 7 is a plan view of an active-matrix substrate, showing the layout of a protective circuit of a second embodiment.
Figure 8:
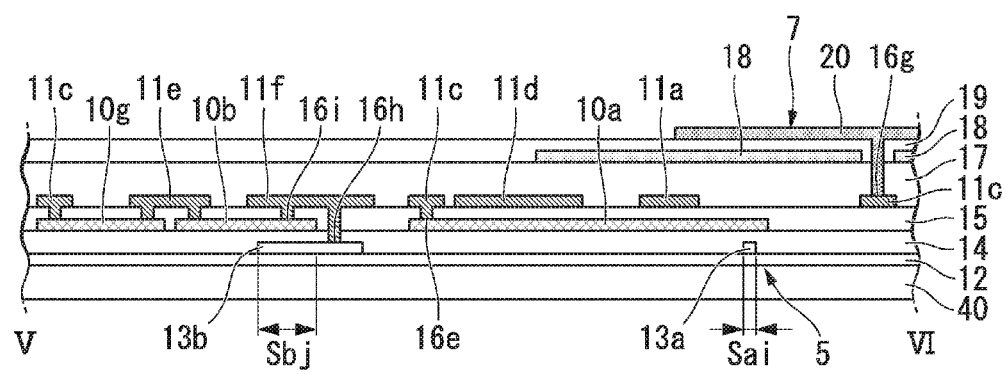
FIG. 8 is a cross-sectional view along the line V-VI in FIG. 7.

In FIG. 7 and FIG. 8, constituent elements that are the same as those in FIG. 3, FIG. 4A, and FIG. 4B used in the description of the basic constitution are assigned the same reference symbols, and the detail description thereof will be omitted.

FIG. 7 is a plan view of an active-matrix substrate 300 of the present embodiment, showing the layout of the protective TFTs 6a and 6b and the like.

The points of difference in FIG. 7 from FIG. 3 are the point of the use of connecting interconnects 11e on the same layer as the signal lines 11a for all of the plurality of connecting interconnects that electrically connect the common scanning interconnect 10b and the protective TFTs 6b, the point of providing a plurality of semiconductor layers 13b (second semiconductor layers) on the same layer as the semiconductor layer 13a (first semiconductor layer) for the protective TFTs and a part of the semiconductor layers 13b being overlapped with the common scanning interconnect 10b when seen in plan view, and the point of providing a relay interconnect 11f on the same layer as the signal lines 11a and a part of the relay interconnect 11f being overlapped with the common scanning interconnect 10b when seen in plan view.

In the second embodiment, a first edge part of the semiconductor layer 13b (lower edge part in FIG. 7) overlaps with the common scanning interconnect 10b when seen in plan view, and a second edge part of the semiconductor layer 13b (upper edge part in FIG. 7) extends outward toward one side in the width direction (upward in FIG. 7) of the common scanning interconnect 10b.

FIG. 8 is a cross-sectional view along the line V-VI in FIG. 7.

Another point of difference of the present embodiment (FIG. 7 and FIG. 8) from the basic constitution (FIG. 3, FIG. 4A, and FIG. 4B) is that, at the point in time when the protective circuit 30 is formed, as shown in FIG. 8, the common scanning interconnect 10b and the relay interconnect 11f are electrically connected via the contact hole 16i, and the relay interconnect 11f and the semiconductor layer 13b are electrically connected via the contact hole 16h. That is, the common scanning interconnect 10b and the semiconductor layer 13b are electrically connected via the relay interconnect 11f.

According to the above-noted constitution, before the protective circuit 30 is formed, by adjusting the surface area of the semiconductor layer 13b overlapping with the common scanning interconnect 10b that is one independent island when seen in plan view, the phenomenon of breakdown by static electricity between the scanning lines 10a and neighboring interconnects, which is in this case between the scanning lines 10a and the common scanning interconnect 10b, can be prevented. Specifically, the surface area of overlapping between the semiconductor layers 13a for a plurality of pixel circuits and the scanning line 10a and the surface area of overlapping between the plurality of semiconductor layers 13b and the common scanning interconnect 10b are made substantially equal.

To describe this specifically, with regard to the present embodiment, the left side Sai [μm²] of Equation 5 is a value regarding the semiconductor layer 13a of the i-th pixel TFT 5. Because this value is established by constraints imposed by the performance of the pixel TFT 5, the manufacturing process and the like, it is the same value for all the pixel TFTs 5. Let this value be Sa. The Sbj [μm²] on the right side of Equation 5 represents each of the surface areas of overlapping between the semiconductor layers 13b with the common scanning interconnect 10b that is one independent island when seen in plan view. In the present embodiment, as a convenience, the surface areas of each of the overlapping parts are set to prescribed values and the value will be called Sb'. The m [quantity] in Equation 5 represents the number of pixel TFTs 5 electrically connected to scanning line 10a that is one independent island. The n [quantity] represents the number of semiconductor layers 13b overlapping with the common scanning interconnect 10b that is one independent island when seen in plan view. In this case, as a convenience, the value is set to the value of n before adjustment in the first embodiment, that is, to n=1280 [quantity].

Given this, from Equation 5, we have the following.

$$\Sigma Sai = \Sigma Sbj (i=1,2,\ldots,m)(j=1,2,\ldots,n)$$

$$\rightarrow m \times Sa = n \times Sb'$$

$$\rightarrow Sb' = (m \times Sa)/n \; [\mu m^2] \quad \text{(Equation 14)}$$

For example, if the size display region for image display is 6.95 inches and the image resolution is WXGA, Sa=52.25 [µm²] and m=2400 [quantity].

From Equation 14, we have the following.

$$Sb' = (2400 \times 52.25)/1280 \approx 97.969 \; [\mu m^2]$$

That is, when seen in plan view, each of the surface areas of the overlapping parts between the common scanning interconnect 10b that is one independent island and the semiconductor layers 13b can be made 97.97 [µm²] as the value that minimizes the value of ΔQ.

Although it is optimal if each of the surface areas of overlapping between the common scanning interconnect 10b that is one independent island and the semiconductor layers 13b is 97.97 [µm²], they need not coincide with 97.97 [µm²]. For example, the values may be made in the range of approximately 79 to 117 [µm²].

The reason for this is as follows.

As described above, from Equation (13), because it is sufficient if $|\Sigma Sai - \Sigma Sbj| = |m \times Sa - n \times Sb'| < 2.50 \times 10^4$ is satisfied, from m=2400 [quantity], Sa=52.25 [µm²], and n=1280 [quantity], we have 78.4<Sb'<117.5.

Thus, as described above, when seen in plan view, each of the surface areas of the overlapping parts between the common scanning interconnect 10b that is one independent island and the semiconductor layers 13b may be approximately 79 to 117 [µm²].

The interconnect width and interconnect length of a scanning line 10a that is one independent island, the interconnect width and the interconnect length of the common scanning interconnect 10b that is one independent island, the interconnect width of the supplementary capacitance line 11d, and the spacing between the scanning lines 10a and the common scanning interconnect 10b are set to values that are the same as in the first embodiment. These values are set so that the surface area of a scanning line 10a that is one independent island and the surface area of the common scanning interconnect 10b that is one independent island are substantially equal, and to make the amount of charge directly accumulated on each the same as much possible.

Specifically, it is preferable that the ratio of the surface area of a common scanning interconnect 10b that is one independent island to the surface area of a scanning line 10a that is one independent island is in the range from +0.8 to +1.2.

The length E1 of one side of each of the surface areas Sb' (dimension in the direction that is perpendicular to the direction of extension of the common scanning interconnect 10b) of overlapping between common scanning interconnect 10b that is one independent island and the semiconductor layers 13b is set to 10.1 [µm] when seen in plan view. The length E2 of the other side (dimension in the direction parallel to the direction of extension of the common scanning interconnect 10b) is set to 9.7 [µm].

Additionally, at the point at which the protective circuit 30 is formed, the common scanning interconnect 10b and the relay interconnect 11f are electrically connected via the contact hole 16i and the relay interconnect 11f and the semiconductor layers 13b are electrically connected via the contact hole 16h. This allows charge that has accumulated on the semiconductor layers 13b to escape to the common scanning interconnect 10b, and prevents the accumulation of charge caused by electrostatic induction onto the common scanning interconnect 10b. Naturally, after the formation of the protective circuit 30, if a scanning line 10a or a signal line 11a is at a high voltage because of accumulation of a charge, the protective TFT 6a or protective TFT 6b discharges, allowing the charge to escape to the common scanning interconnect 10b or the common signal interconnect 11b, thereby enabling prevention of the phenomenon of breakdown by static electricity.

Additionally, in the present embodiment, connecting interconnects 11e on the same layer as the signal lines 11a are used for all the connecting interconnects that electrically connect the common scanning interconnect 10b and the protective TFTs 6b. This enables avoidance of breakdown of the protective TFT 6b by static electricity when a charge is accumulated on the common scanning interconnect 10b.

(Third Embodiment)

A liquid crystal display device of the third embodiment will now be described, using FIG. 9 and FIG. 10.

Although the basic constitution of the liquid crystal display device of the third embodiment is as described using FIG. 3, FIG. 4A, and FIG. 4B, the constitution regarding the protective circuit is different from FIG. 3, FIG. 4A, and FIG. 4B.

Figure 9:
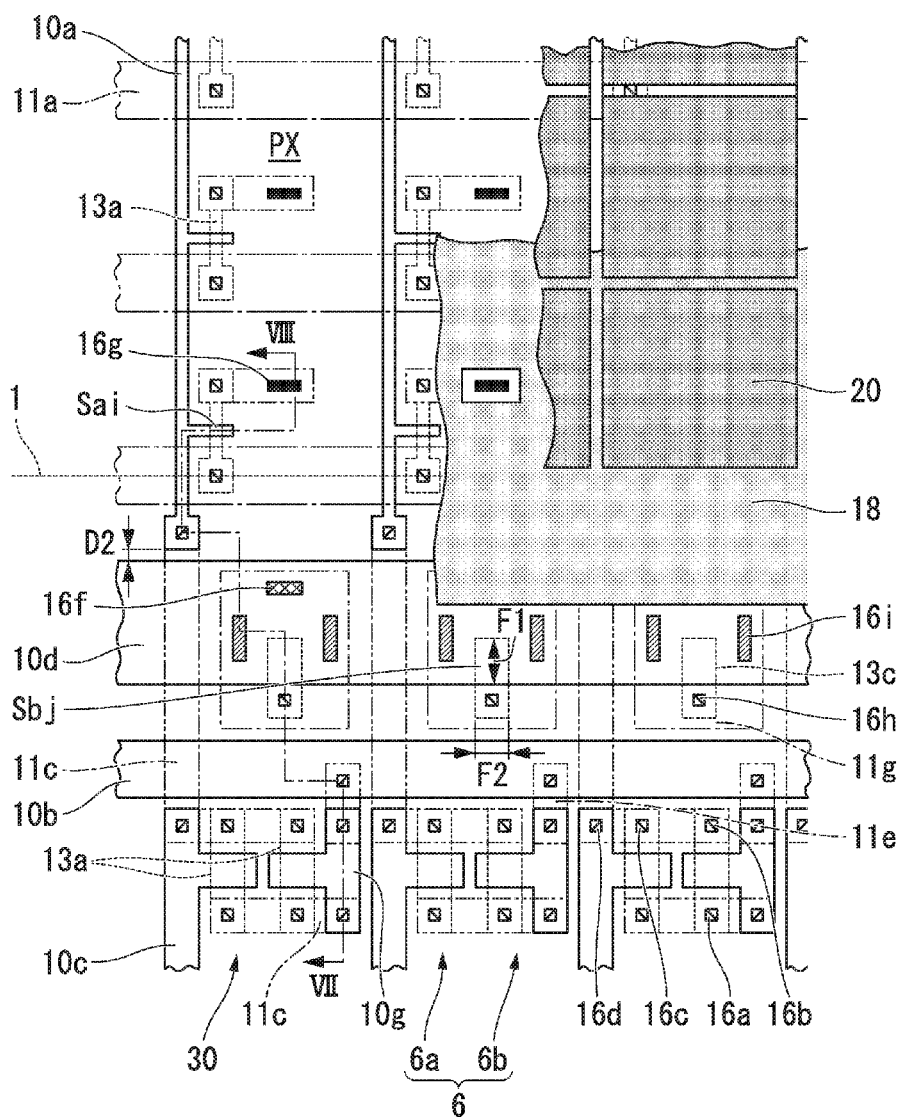
FIG. 9 is a plan view of an active-matrix substrate, showing the layout of a protective circuit of a third embodiment.
Figure 10:
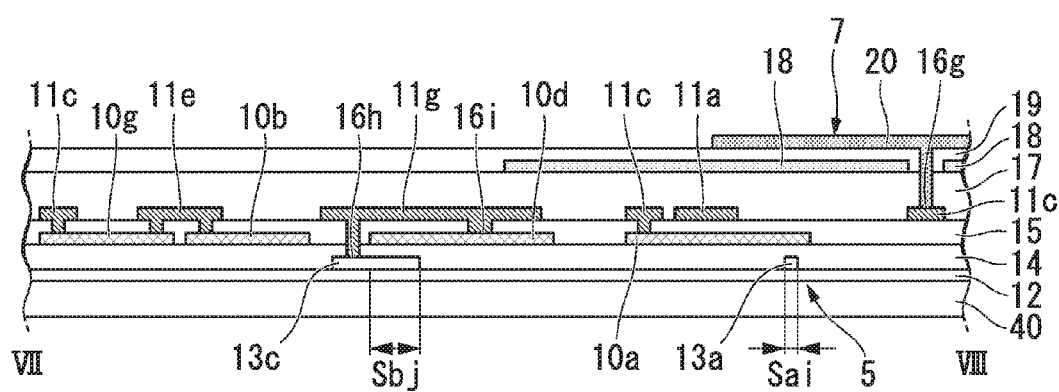
FIG. 10 is a cross-sectional view along the line VII-VIII in FIG. 9.

In FIG. 9 and FIG. 10, constituent elements that are the same as those in FIG. 3, FIG. 4A, and FIG. 4B used in the description of the basic constitution are assigned the same reference symbols, and the detail description thereof will be omitted.

FIG. 9 is a plan view of an active-matrix substrate 400 of the present embodiment, showing the layout of the protective TFTs 6a and 6b and the like.

The points of difference in FIG. 9 from FIG. 3 are the point of the use of connecting interconnects 11e on the same layer as the signal lines 11a for all of the plurality of connecting interconnects that electrically connect the common scanning interconnect 10b and the protective TFTs 6b, the point of using a supplementary capacitance line 10d on the same layer as the scanning lines 10a, the point of providing a plurality of semiconductor layers 13c (second semiconductor layers) on the same layer as the semiconductor layer 13a (first semiconductor layer) for the protective TFTs and a part of the semiconductor layers 13c being overlapped with the common scanning interconnect 10b when seen in plan view, and the point of providing a relay interconnect 11g on the same layer as the signal lines 11a and a part of the relay interconnect 11g being overlapped with the supplementary capacitance line 10d when seen in plan view.

In the case of the present embodiment, a semiconductor layer 13c is provided to each column of pixels PX aligned in the direction of extension of the scanning lines 10a. A first edge part of the semiconductor layer 13c (upper edge part in FIG. 9) overlaps with the supplementary capacitance line 10d when seen in plan view, and a second edge part (lower edge part in FIG. 9) extends outward toward one side in the width direction (lower side in FIG. 9) of the supplementary capacitance line 10d.

FIG. 10 is a cross-sectional view along the line VII-VIII in FIG. 9.

Another point of difference of the present embodiment (FIG. 9 and FIG. 10) from the basic constitution (FIG. 3, FIG. 4A, and FIG. 4B) is that, at the point in time when the protective circuit 30 is formed, as shown in FIG. 10, the supplementary capacitance line 10d and the relay interconnect 11g are electrically connected via the contact hole 16i, and the relay interconnect 11g and the semiconductor layer 13c are electrically connected via the contact hole 16h. That is, the supplementary capacitance line 10d and the semiconductor layer 13c are electrically connected via the relay interconnect 11g.

Accordingly, before the protective circuit 30 is formed, by adjusting the surface area of the semiconductor layer 13c overlapping with the supplementary capacitance line 10d that is one independent island when seen in plan view, the phenomenon of breakdown by static electricity between the scanning lines 10a and neighboring interconnects, which is in this case between the scanning lines 10a and the supplementary capacitance line 10d, can be prevented. Specifically, the surface area of the overlapping part between the semiconductor layer 13a for a plurality of pixel circuits and the scanning lines 10a and the surface area of overlapping between the plurality of semiconductor layers 13c and the supplementary capacitance lines 10d are made substantially equal.

To describe this specifically, with regard to the present embodiment, the left side Sai [μm$^2$] of Equation 5 is a value regarding the semiconductor layer 13a of the i-th pixel TFT 5. Because this value is established by constraints imposed by the performance of the pixel TFT 5, the manufacturing process and the like, it is the same value for all the pixel TFTs 5. Let this value be Sa. The Sbj [μm$^2$] on the right side of Equation 5 represents each of the surface areas of overlapping between the semiconductor layers 13c and the supplementary capacitance line 10d that is one independent island when seen in plan view. In the present embodiment, as a convenience, the surface areas are set to prescribed values and the value will be called Sb'. The m [quantity] in Equation 5 represents the number of pixel TFTs 5 electrically connected to scanning line 10a that is one independent island. The n [quantity] represents the number of semiconductor layers 13c overlapping with the supplementary capacitance line 10d that is one independent island when seen in plan view. In this case, as a convenience, the value is set to the value of n before adjustment in the first embodiment, that is, to n=1280 [quantity].

In this case, if the value of Sb' is determined from Equation 5, the value is 97.97 [μm$^2$], the same as in the second embodiment.

Also, the same as in the second embodiment, the value of Sb' may be, for example, approximately 79 to 117 [μm$^2$].

The interconnect width of a scanning line 10a that is one independent island, the interconnect width and interconnect length of the common scanning interconnect 10b that is one independent island, and the interconnect width of the supplementary capacitance line 10d are the same values as in the first embodiment. The interconnect length of the scanning line 10a is set to 93,700 [μm]. The spacing D2 between the scanning line 10a and the supplementary capacitance line 10d is set to 10 [μm]. The length F1 of one side of each of the surface areas Sb' (dimension in the direction that is perpendicular to the direction of extension of the supplementary capacitance line 10d) of overlapping between the supplementary capacitance line 10d that is one independent island and the semiconductor layer 13c is set to 10.1 [μm] when seen in plan view. The length F2 of the other side (dimension in the direction parallel to the direction of extension of the supplementary capacitance line 10d) is set to 9.7 [μm$^2$].

Additionally, at the point at which the protective circuit 30 is formed, the supplementary capacitance line 10d and the relay interconnect 11g are electrically connected via the contact hole 16i and the relay interconnect 11g and the semiconductor layers 13c are electrically connected via the contact hole 16h. This allows charge that has accumulated on the semiconductor layers 13c to escape to the supplementary capacitance line 10d, and eliminates the accumulation of charge caused by electrostatic induction onto the supplementary capacitance line 10d. When this occurs, because the supplementary capacitance line 10d and the relay interconnect 11g have a stacked construction, the resistance value of the overall interconnect is reduced. For that reason, when the liquid crystal display device 50 is driven a stable voltage can be applied to the common electrode 18. Naturally, after the formation of the protective circuit 30, if a scanning line 10a or a signal line 11a is at a high voltage because of accumulation of a charge, the protective TFT 6a or protective TFT 6b discharges, allowing the charge to escape to the common scanning interconnect 10b or the common signal interconnect 11b, thereby enabling prevention of the phenomenon of breakdown by static electricity.

Additionally, in the present embodiment, connecting interconnects 11e on the same layer as the signal lines 11a are used for all the connecting interconnects that electrically connect the common scanning interconnect 10b and the protective TFTs 6b. This enables avoidance of breakdown of the protective TFT 6b by static electricity when a charge is accumulated on the common scanning interconnect 10b.

(Fourth Embodiment)

A liquid crystal display device of the fourth embodiment will now be described, using FIG. 11 and FIG. 12.

Although the basic constitution of the liquid crystal display device of the fourth embodiment is as described using FIG. 3, FIG. 4A, and FIG. 4B, the constitution regarding the protective circuit is different from FIG. 3, FIG. 4A, and FIG. 4B.

Figure 11:
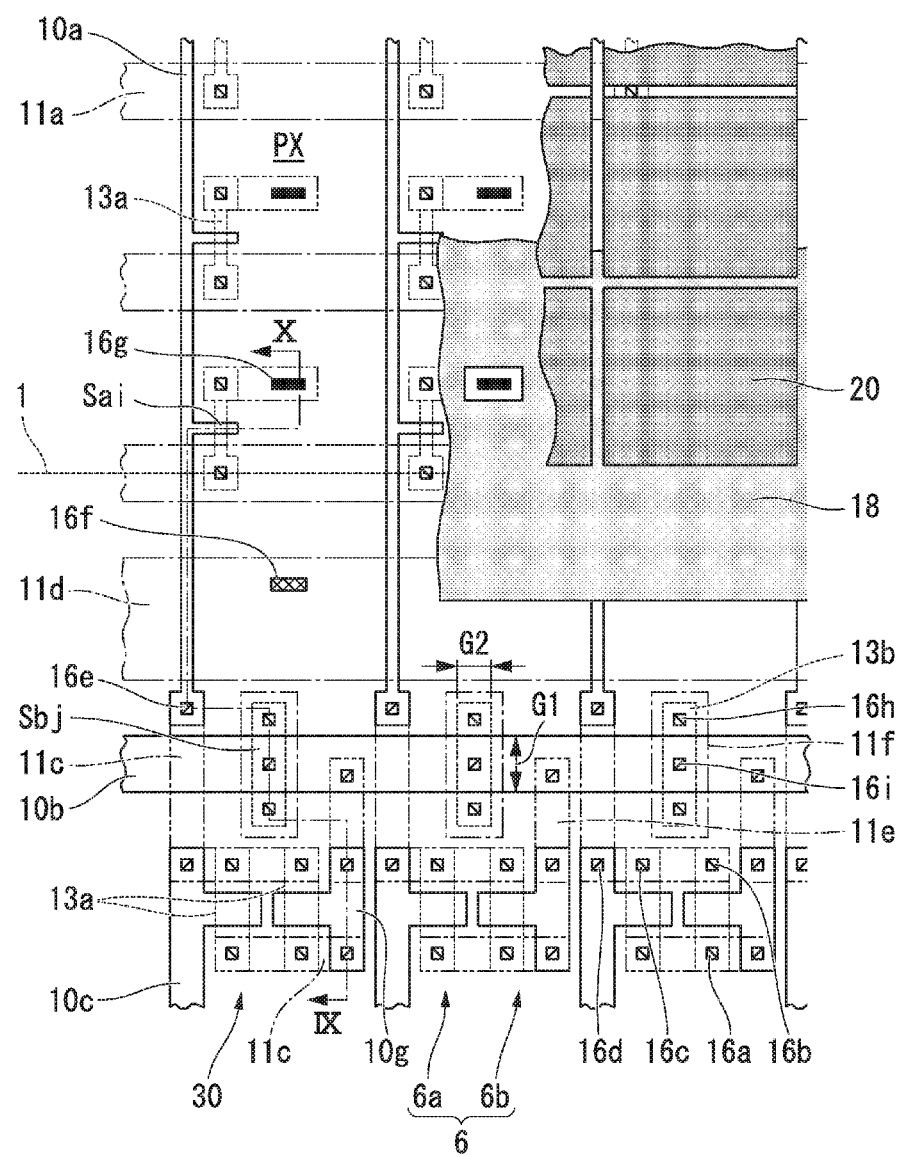
FIG. 11 is a plan view of an active-matrix substrate, showing the layout of a protective circuit of a fourth embodiment.
Figure 12:
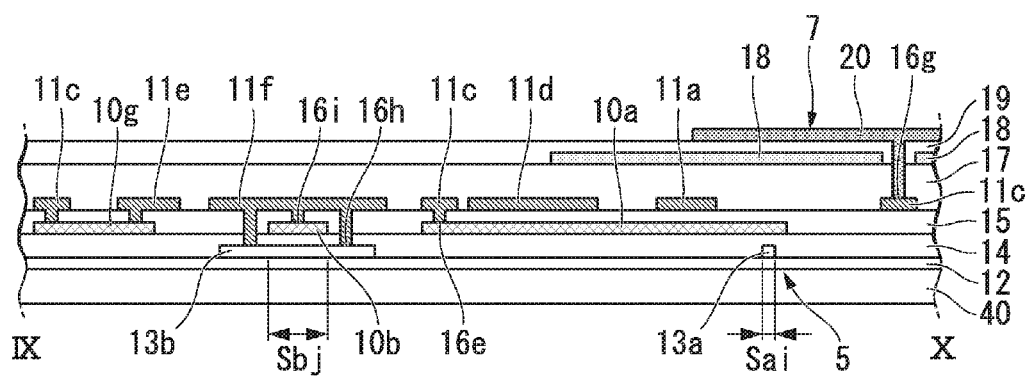
FIG. 12 is a cross-sectional view along the line IX-X in FIG. 11.

In FIG. 11 and FIG. 12, constituent elements that are the same as those in FIG. 3, FIG. 4A, and FIG. 4B used in the description of the basic constitution are assigned the same reference symbols, and the detail description thereof will be omitted.

FIG. 11 is a plan view of an active-matrix substrate 500 of the present embodiment, showing the layout of the protective TFTs 6a and 6b and the like.

The points of difference in FIG. 11 from FIG. 3 are the point of the use of connecting interconnects 11e on the same layer as the signal lines 11a for all of the plurality of connecting interconnects that electrically connect the common scanning interconnect 10b and the protective TFTs 6b, the point of providing a plurality of semiconductor layers 13b (second semiconductor layers) on the same layer as the semiconductor layer 13a (first semiconductor layer) for the protective TFTs and a part of the semiconductor layers 13b being overlapped with the common scanning interconnect 10b when seen in plan view, and the point of providing a relay interconnect 11f on the same layer as the signal lines 11a and a part of the relay interconnect 11f being overlapped with the common scanning interconnect 10b when seen in plan view.

In the earlier described second embodiment, one edge part of the semiconductor layer 13b (upper edge part in FIG. 7) extends outward toward one side of the common scanning interconnect 10b in the width direction (upward in FIG. 7). In contrast, in the present embodiment, the center part of the semiconductor layers 13b overlaps with the common scanning interconnect 10b when seen in plan view, and edge parts on both sides of the semiconductor layers 13b (the upper edge part and the lower edge part in FIG. 11) extend outward from both sides of the common scanning interconnect 10b in the width direction.

FIG. 12 is a cross-sectional view along the line IX-X in FIG. 11.

Another point of difference of the present embodiment (FIG. 11 and FIG. 12) from the basic constitution (FIG. 3, FIG. 4A, and FIG. 4B) is that, at the point in time when the protective circuit 30 is formed, as shown in FIG. 12, the common scanning interconnect 10b and the relay interconnect 11f are electrically connected via the contact hole 16i, and the relay interconnect 11f and the semiconductor layer 13b are electrically connected via two contact holes 16h sandwiching the common scanning interconnect 10b. That is, the common scanning interconnect 10b and the semiconductor layer 13b are electrically connected via the relay interconnect 11f.

Accordingly, before the protective circuit 30 is formed, by adjusting the surface area of the semiconductor layer 13b overlapping with the common scanning interconnect 10b that is one independent island when seen in plan view, the phenomenon of breakdown by static electricity between the scanning lines 10a and neighboring interconnects, which is in this case between the scanning lines 10a and the common scanning interconnect 10b, can be prevented. Specifically, the surface area of the overlapping part between the semiconductor layers 13a for a plurality of pixel TFTs and the scanning line 10a and the surface area of the overlapping part between the plurality of semiconductor layers 13b and the common scanning interconnect 10b are made substantially equal.

To describe this specifically, with regard to the present embodiment, the left side Sai [μm²] of Equation 5 is a value regarding the semiconductor layer 13a of the i-th pixel TFT 5. Because this value is established by constraints imposed by the performance of the pixel TFT 5, the manufacturing process and the like, it is the same value for all the pixel TFTs 5. Let this value be Sa. The Sbj [μm²] on the right side of Equation 5 represents each of the surface areas of overlapping between the semiconductor layers 13b and the common scanning interconnect 10b that is one independent island when seen in plan view. In the present embodiment, as a convenience, the surface areas of each of the overlapping parts are set to prescribed values and the value will be called Sb'. The m [quantity] in Equation 5 represents the number of pixel TFTs 5 electrically connected to scanning line 10a that is one independent island. The n [quantity] represents the number of semiconductor layers 13b overlapping with the common scanning interconnect 10b that is one independent island when seen in plan view. In this case, as a convenience, the value is set to the value of n before adjustment in the first embodiment, that is, to n=1280 [quantity].

In this case, if the value of Sb' is determined from Equation 5, the value is 97.97 [μm²], the same as in the second embodiment.

Also, the same as in the second embodiment, the value of Sb' may be, for example, approximately 79 to 117 [μm²].

The interconnect width and the interconnect length of a scanning line 10a that is one independent island, the interconnect width and interconnect length of the common scanning interconnect 10b that is one independent island, the interconnect width of the supplementary capacitance line 11d and the spacing between the scanning lines 10a and the common scanning interconnect 10b are the same values as in the first embodiment. These values are set so that the surface area of a scanning line 10a that is one independent island and the surface area of the common scanning interconnect 10b that is one independent island are substantially equal, and to make the amount of charge directly accumulated on each the same as much as possible.

Specifically, it is preferable that the ratio of the surface area of a common scanning interconnect 10b that is one independent island to the surface area of a scanning line 10a that is one independent island is in the range from +0.8 to +1.2.

The length G1 of one side of each of the surface areas Sb' (dimension in the direction that is perpendicular to the direction of extension of the common scanning interconnect 10b) of overlapping between common scanning interconnect 10b that is one independent island and the semiconductor layers 13b is set to 15 [μm] when seen in plan view. The length G2 of the other side (dimension in the direction parallel to the direction of extension of the common scanning interconnect 10b) is set to 6.5 [μm]. By doing this, the surface area Sb' is 97.5 [μm²], this being in the vicinity of the value that minimizes ΔQ, that is, the value 97.97 [μm²] that has been calculated in the second embodiment.

In the process of manufacturing an active-matrix substrate, there are cases in which slight misalignment between the patterns on each layer are unavoidable. For example, let us assume that misalignment has occurred between the common scanning interconnect 10b and the semiconductor layer 13b. When this occurs, if the misalignment between the common scanning interconnect 10b and the semiconductor layer 13b is in a direction that is parallel to the direction of extension of the common scanning interconnect 10b, the surface area of the overlapping part between the common scanning interconnect 10b and the semiconductor layer 13b does not change. However, in the case of the second embodiment as shown in FIG. 7, if the misalignment between the common scanning interconnect 10b and the semiconductor layer 13b is in a direction perpendicular to the direction of extension of the common scanning interconnect 10b (up and down directions in the drawing), the surface area of the overlapping part between the common scanning interconnect 10b and the semiconductor layer 13b changes, and the effect of suppressing the phenomenon of breakdown by static electricity diminishes.

In contrast, in the case of the present embodiment, both edge parts of the semiconductor layer 13b (upper edge part and lower edge part in FIG. 11) extend outward from both sides of the common scanning interconnect 10b in the width direction. For that reason, even if the common scanning interconnect 10b and the semiconductor layer 13b be misaligned in a direction that is perpendicular to the direction of extension of the common scanning interconnect 10b (upward and downward in FIG. 11), the surface area of the overlapping part between the common scanning interconnect 10b and the semiconductor layer 13b does not change. Therefore, even if there is misalignment due to the manufacturing process, it is possible to maintain the effect of suppressing the phenomenon of breakdown by static electricity.

Additionally, at the point at which the protective circuit 30 is formed, the common scanning interconnect 10b and the relay interconnect 11f are electrically connected via the contact hole 16i and the relay interconnect 11f and the semiconductor layers 13b are electrically connected via the contact hole 16h. This allows charge that has accumulated on the semiconductor layers 13b to escape to the common scanning interconnect 10b, and eliminates the accumulation of charge caused by electrostatic induction onto the common scanning interconnect 10b. Naturally, after the formation of the protective circuit 30, if a scanning line 10a or a signal line 11a is at a high voltage because of accumulation of a charge, the protective TFT 6a or protective TFT 6b discharges, allowing the charge to escape to the common scanning interconnect 10b or the common signal interconnect 11b, thereby enabling prevention of the phenomenon of breakdown by static electricity.

Additionally, in the present embodiment, connecting interconnects 11e on the same layer as the signal lines 11a are used for all the connecting interconnects that electrically connect the common scanning interconnect 10b and the protective TFTs 6b. This enables avoidance of breakdown of the protective TFT 6b by static electricity when a charge is accumulated on the common scanning interconnect 10b.

(Fifth Embodiment)

A liquid crystal display device of the fifth embodiment will now be described, using FIG. 13 and FIG. 14.

Although the basic constitution of the liquid crystal display device of the fifth embodiment is as described using FIG. 3, FIG. 4A, and FIG. 4B, the constitution regarding the protective circuit is different from FIG. 3, FIG. 4A, and FIG. 4B.

Figure 13:
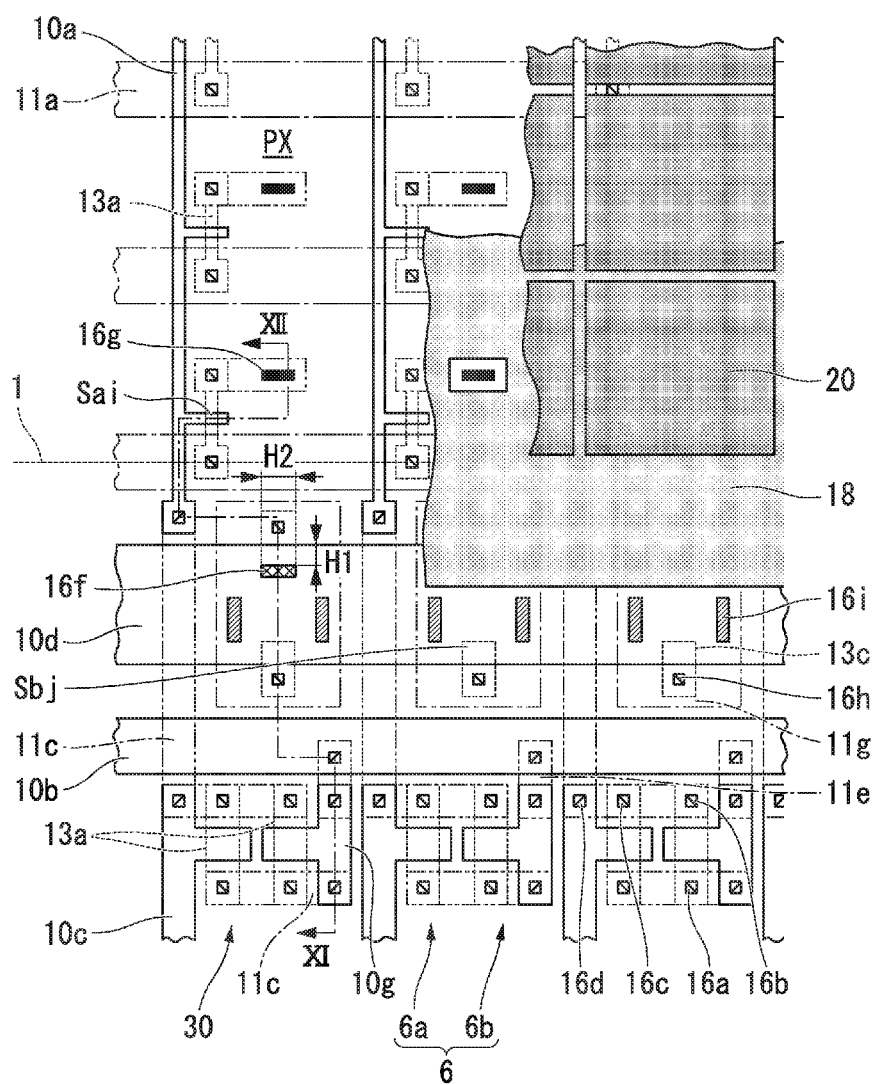
FIG. 13 is a plan view of an active-matrix substrate, showing the layout of a protective circuit of a fifth embodiment.
Figure 14:
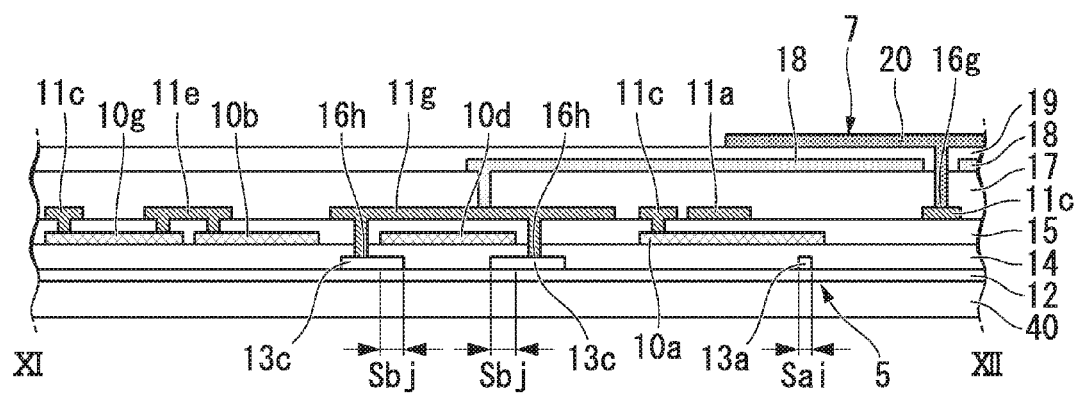
FIG. 14 is a cross-sectional view along the line XI-XII in FIG. 13.

In FIG. 13 and FIG. 14, constituent elements that are the same as those in FIG. 3, FIG. 4A, and FIG. 4B used in the description of the basic constitution are assigned the same reference symbols, and the detail description thereof will be omitted.

FIG. 13 is a plan view of an active-matrix substrate 600 of the present embodiment, showing the layout of the protective TFTs 6a and 6b and the like.

The points of difference in FIG. 13 from FIG. 3 are the point of the use of connecting interconnects 11e on the same layer as the signal lines 11a for all of the plurality of connecting interconnects that electrically connect the common scanning interconnect 10b and the protective TFTs 6b, the point of using a supplementary capacitance line 10d on the same layer as the scanning lines 10a, the point of providing a plurality of semiconductor layers 13c (second semiconductor layers) on the same layer as the semiconductor layer 13a (first semiconductor layer) for the protective TFTs and a part of the semiconductor layers 13c being overlapped with the supplementary capacitance line 10d when seen in plan view, and the point of providing a relay interconnect 11g on the same layer as the signal lines 11a and a part of the relay interconnect 11g being overlapped with the supplementary capacitance line 10d when seen in plan view.

In the earlier-described third embodiment, one semiconductor layer 13c has been provided for each pixel column and one edge part of that semiconductor layer 13c (the lower edge part in FIG. 9) extended outward toward one side of the supplementary capacitance line 10d (downward in FIG. 9) in the width direction thereof. In contrast, in the present embodiment, two semiconductor layers 13c each are provided for a column of pixels PX arranged in the direction of extension of the scanning lines 10a, these two semiconductor layers 13c being disposed at the upper side and the lower side of the supplementary capacitance line 10d. The first edge parts of each of the two semiconductor layers 13c (mutually opposing edge parts of the two semiconductor layers 13c in FIG. 13) overlap with the supplementary capacitance line 10d when seen in plan view. The second edge parts of each of the two semiconductor layers 13c (mutually separated side edge parts of the two semiconductor layers 13c in FIG. 13) extend outward from both sides of the supplementary capacitance line 10d in the width direction (upward and downward in FIG. 13) thereof.

FIG. 14 is a cross-sectional view along the line XI-XII in FIG. 13.

Another point of difference of the present embodiment (FIG. 13 and FIG. 14) from the basic constitution (FIG. 3, FIG. 4A, and FIG. 4B) is that, at the point in time when the protective circuit 30 is formed, the supplementary capacitance line 10d and the relay interconnect 11g are electrically connected (refer to FIG. 13) via the contact hole 16i, and the relay interconnect 11g and the semiconductor layer 13c are electrically connected via the contact hole 16h (refer to FIG. 13 and FIG. 14). That is, the supplementary capacitance line 10d and the semiconductor layer 13c are electrically connected via the relay interconnect 11g.

Accordingly, before the protective circuit 30 is formed, by adjusting the surface area of the semiconductor layer 13c overlapping with the supplementary capacitance line 10d that is one independent island when seen in plan view, the phenomenon of breakdown by static electricity between the scanning lines 10a and neighboring interconnects, which is in this case between the scanning lines 10a and the supplementary capacitance line 10d, can be suppressed. Specifically, the surface area of the overlapping part between the semiconductor layer 13a for a plurality of pixel circuits and the scanning lines 10a and the surface area of the overlapping part between the plurality of semiconductor layers 13c and the supplementary capacitance lines 10d are made substantially equal.

To describe this specifically, with regard to the present embodiment, the left side Sai [$\mu m^2$] of Equation 5 is a value regarding the semiconductor layer 13a of the i-th pixel TFT 5. Because this value is established by constraints imposed by the performance of the pixel TFT 5, the manufacturing process and the like, it is the same value for all the pixel TFTs 5. Let this value be Sa. The Sbj [$\mu m^2$] on the right side of Equation 5 represents each of the surface areas of the overlapping parts between the semiconductor layers 13c and the supplementary capacitance line 10d that is one independent island when seen in plan view. In the present embodiment, as a convenience, the surface areas are set to prescribed values and the value will be called Sb'. The m [quantity] in Equation 5 represents the number of pixel TFTs 5 electrically connected to scanning lines 10a that are one independent island. The n [quantity] represents the number of semiconductor layers 13c overlapping with the supplementary capacitance line 10d that is one independent island when seen in plan view. In this case, as a convenience, the value is set to two times the value of n before adjustment in the first embodiment, that is, to n=1280×2=2560 [quantity].

In this case, from Equation (5), we have the following.

$$\Sigma Sai = \Sigma Sbj (i=1,2,\ldots,m)(j=1,2,\ldots,n)$$

$$\rightarrow m \times Sa = n \times Sb'$$

$$\rightarrow Sb' = (m \times Sa)/n [\mu m^2] \qquad \text{(Equation 14)}$$

For example, if the size display region for image display is 6.95 inches and the image resolution is WXGA, Sa=52.25 [$\mu m^2$] and m=2400 [quantity].

From Equation (14), we have the following.

$$Sb' = (2400 \times 52.25)/2560 \approx 48.984 [\mu m^2]$$

Thus, when seen in plan view, each of the surface areas of the overlapping parts between supplementary capacitance line 10d that is one independent island and the semiconductor layer 13b may be designed to be 48.98 [$\mu m^2$] as the value that minimizes the value of $\Delta Q$.

Although it is optimal if each of the surface areas of the overlapping parts between the supplementary capacitance line 10d that is one independent island and the semiconductor layers 13b is 48.98 [µm²], they need not coincide with 48.98 [µm²]. For example, the values may be made in the range of approximately 40 to 58 [µm²]. The reason for this is as follows.

As described above, from Equation (13), because it is sufficient if |ΣSai−ΣSbj|=|m×Sa−n×Sb'|<2.50×10⁴ is satisfied, from m=2400 [quantity], Sa=52.25 [µm²], and n=2× 1280=2560 [quantity], we have 39.2<Sb'<58.8.

Thus, as described above, each of the surface areas of the overlapping parts between the supplementary capacitance line 10d that is one independent island and the semiconductor layer 13b may be made a value of approximately 40 to 58 [µm²].

The interconnect width of a scanning line 10a that is one independent island, the interconnect width and interconnect length of the common scanning interconnect 10b that is one independent island, and the interconnect width of the supplementary capacitance line 10d are the same values as in the first embodiment. The interconnect length of the scanning line 10a and the spacing between the scanning line 10a and the supplementary capacitance line 10d are the same as in the third embodiment. The length H1 of one side of each of the surface areas Sb' (dimension in the direction that is perpendicular to the direction of extension of the supplementary capacitance line 10d) of the overlapping part between the supplementary capacitance line 10d that is one independent island and the semiconductor layer 13c is set to 7.9 [µm] when seen in plan view. The length H2 of the other side (dimension in the direction parallel to the direction of extension of the supplementary capacitance line 10d) is set to 6.2 [µm].

In the fifth embodiment, two semiconductor layers 13c each are provided for each pixel column, and the mutually separated side edge parts of the two semiconductor layers 13c extend outward from both side of the supplementary capacitance line 10d in the width direction thereof. For that reason, even if there is a misalignment between the supplementary capacitance line 10d and the semiconductor layers 13c in a direction that is perpendicular to the extension direction of the supplementary capacitance line 10d (upward or downward in FIG. 13), the surface area of the overlapping part between the supplementary capacitance line 10d and the semiconductor layer 13c does not change. It is thus possible to maintain the effect of suppressing the phenomenon of breakdown by static electricity even if misalignment caused by the manufacturing process occurs.

Additionally, at the point at which the protective circuit 30 is formed, the supplementary capacitance line 10d and the relay interconnect 11g are electrically connected via the contact hole 16i and the relay interconnect 11g and the semiconductor layers 13c are electrically connected via the contact hole 16h. This allows charge that has accumulated on the semiconductor layers 13c to escape to the supplementary capacitance line 10d, and eliminates the accumulation of charge caused by electrostatic induction onto the supplementary capacitance line 10d.

Because the interconnects overall are a stacked structure of the supplementary capacitance line 10d and the relay interconnect 11g, the interconnect resistance is reduced, and a stable voltage can be applied to the common electrode 18 with the liquid crystal display device is driven. Naturally, after the formation of the protective circuit 30, if a scanning line 10a or a signal line 11a is at a high voltage because of accumulation of a charge, the protective TFT 6a or protective TFT 6b discharges, allowing the charge to escape to the common scanning interconnect 10b or the common signal interconnect 11b, thereby enabling prevention of the phenomenon of breakdown by static electricity.

Additionally, in the present embodiment, connecting interconnects 11e on the same layer as the signal lines 11a are used for all the connecting interconnects that electrically connect the common scanning interconnect 10b and the protective TFTs 6b. This enables avoidance of breakdown of the protective TFT 6b by static electricity when a charge is accumulated on the common scanning interconnect 10b.

The technical scope of the present invention is not restricted to the above-noted embodiments, and can be subjected to various modifications within the scope of the spirit thereof.

For example, the semiconductor material constituting the pixel TFTs and the protective TFTs can be changed to a Group 14 semiconductor such as silicon, or to an oxide semiconductor or the like. Additionally, the crystallinity of the semiconductor material of each TFT is not particularly restricted, and may be single crystal, polycrystalline, amorphous, or microcrystalline. It is preferable that the oxide semiconductor is at least one element selected from the group of indium (In), gallium (Ga), zinc (Zn), aluminum (Al), and silicon (Si) and includes oxygen (O), and further preferable that it includes In, Ga, Zn, and O.

The form of the TFTs constituting the pixel TFTs and the protective TFTs is not specifically restricted to being top-gate, and can be changed to, for example, bottom-gate or the like, as is appropriate.

Figure 15:
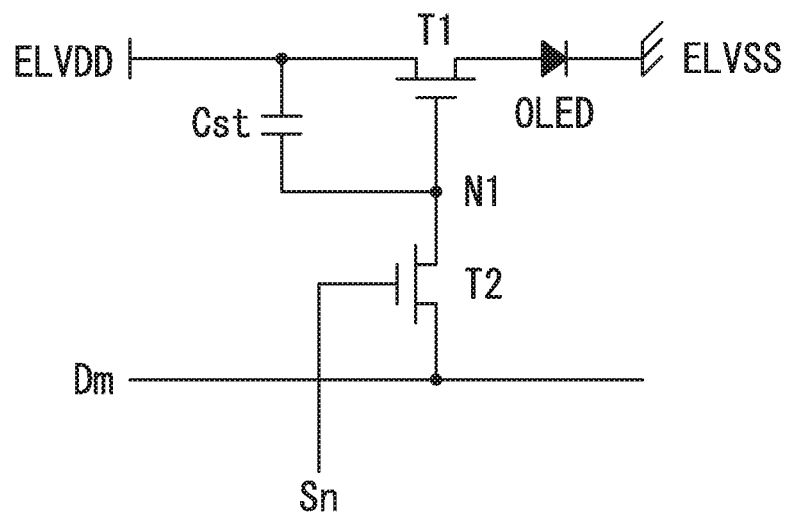
FIG. 15 is an equivalent circuit diagram of a pixel circuit of an organic EL display device.

In recent years, as self-luminous display devices that, compared with liquid crystal display devices, are advantageous in terms of high-speed response, high viewing angle, high contrast, and further reduction in thickness, development of organic EL display devices has been actively conducted. FIG. 15 shows in schematic form an example of the pixel circuit of an organic EL display device. Although a detailed description will be omitted herein, the pixel has a first transistor T1, a second transistor T2, a capacitor Cst, and an organic light-emitting diode (OLED). The source of the first transistor T1 is connected to the first power supply ELVDD, the drain thereof is connected to the anode electrode of the organic light-emitting diode, and the gate thereof is connected to the first node N1. The source of the second transistor T2 is connected to the data line Dm, the drain thereof is connected to the first node N1, and the gate thereof is connected to the scanning line Sn. The first electrode of the capacitor Cst is connected to the first power supply ELVDD, and the second electrode thereof is connected to the first node N1. The anode electrode of the organic light-emitting diode is connected to the drain of the first transistor T1 and the cathode electrode thereof is connected to the second power supply ELVSS.

In this manner, even in an organic EL display device, because a scanning line exists, the present invention can be applied. The present invention can be applied to various types of display devices, without restriction to liquid crystal display devices.

INDUSTRIAL APPLICABILITY

The present invention can be used in various display devices, such as liquid crystal display devices and organic EL display devices.

DESCRIPTION OF THE REFERENCE SYMBOLS

5 Pixel TFT (pixel circuit TFT)
6 Protective diode (protective element)

10a Scanning line
10b Common scanning interconnect (common interconnect)
11a Signal line
10d, 11d Supplementary capacitance line
10f, 11e Connecting interconnect
11f, 11g Relay interconnect
13a, 13b, 13c Semiconductor layer
50 Liquid crystal display device
PX Pixel

The invention claimed is:

1. A display device comprising: a plurality of scanning lines and a plurality of signal lines that mutually intersect; a plurality of pixel circuit thin-film transistors provided at a plurality of pixels partitioned by the plurality of scanning lines and the plurality of signal lines;
   a common scanning interconnect that electrically connects between the plurality of scanning lines; and
   a plurality of protective elements that electrically connect between the common scanning interconnect and each of the plurality of scanning lines,
   wherein at least a part of a plurality of connecting interconnects that electrically connect the common scanning interconnect with the plurality of protective elements are constituted by interconnects on the same layer as the signal lines,
   a plurality of pixel circuit semiconductor layers constituting the plurality of pixel circuit thin-film transistors and each of the plurality of scanning lines overlap when seen in plan view,
   a plurality of semiconductor layers on the same layer as the pixel circuit semiconductor layers and a common interconnect that intersects with the plurality of scanning lines overlap when seen in plan view, and
   the surface area of overlapping parts between the plurality of pixel circuit semiconductor layers and at least one of the plurality of scanning lines and the surface area overlapping parts between the plurality of semiconductor layers and the common interconnect are substantially equal.

2. The display device according to claim 1, wherein the common interconnect is the common scanning interconnect.

3. The display device according to claim 2,
   wherein a part of the connecting interconnects of the plurality of connecting interconnects are constituted by interconnects on the same layer as the signal lines,
   the remaining connecting interconnects of the plurality of connecting interconnects are constituted by interconnects formed as one with the common scanning interconnect,
   the plurality of semiconductor layers are a plurality of first semiconductor layers constituting the plurality of protective elements, and
   the surface area of overlapping parts between the plurality of pixel circuit semiconductor layers and at least one of the plurality of scanning lines and the surface area overlapping parts between the plurality of first semiconductor layers and the common scanning interconnect are substantially equal.

4. The display device according to claim 2,
   wherein the plurality of semiconductor layers are a plurality of second semiconductor layers on the same layer as the pixel circuit semiconductor layers and the protective element first semiconductor layers,
   all of the plurality of connecting interconnects are constituted by interconnects on the same layer as the signal lines,
   and further comprising relay interconnects on the same layer as the signal lines,
   wherein at least a part of the second semiconductor layers and at least a part of the relay interconnects overlap with the common scanning interconnect when seen in plan view,
   the surface area of the overlapping parts between the plurality of pixel circuit semiconductor layers and at least one of the plurality of scanning lines and the surface of the overlapping parts between the plurality of second semiconductor layers and the common scanning interconnect are substantially equal, and
   the common scanning interconnect and at least one of the second semiconductor layers are electrically connected via at least one of the relay interconnects.

5. The display device according to claim 4,
   wherein a first edge part of the second semiconductor layer overlaps with the common scanning interconnect when seen in plan view, and
   a second edge part of the second semiconductor layer extends outward toward one side in the width direction of the common scanning interconnect.

6. The display device according to claim 4,
   wherein a center part of the second semiconductor layer overlaps with the common scanning interconnect when seen in plan view, and
   both edge parts of the second semiconductor layer extend outward from both sides of the common scanning interconnect in the width direction thereof.

7. The display device according to claim 1, further comprising a supplementary capacitance line constituting a supplementary capacitance,
   wherein the common interconnect is the supplementary capacitance line.

8. The display device according to claim 7,
   wherein the plurality of semiconductor layers are a plurality of second semiconductor layers on the same layer as the pixel circuit semiconductor layers and the protective element first semiconductor layers,
   all of the plurality of connecting interconnects are constituted by interconnects on the same layer as the signal lines,
   and further comprising relay interconnects on the same layer as the signal lines,
   wherein at least a part of the second semiconductor layers and at least a part of the relay interconnects overlap with the supplementary capacitance line when seen in plan view,
   the surface area of the overlapping parts between the plurality of pixel circuit semiconductor layers and at least one of the plurality of scanning lines and the surface of the overlapping parts between the plurality of second semiconductor layers and the supplementary capacitance line are substantially equal, and
   the supplementary capacitance line and at least one of the second semiconductor layers are electrically connected via at least one of the relay interconnects.

9. The display device according to claim 8,
   wherein one of the second semiconductor layers is provided with respect to each pixel column,
   a first edge part of the second semiconductor layer overlaps with the supplementary capacitance line when seen in plan view, and
   a second edge part of the second semiconductor layer extends outward toward one side in the width direction of the supplementary capacitance line.

10. The display device according to claim 8,
wherein two of the second semiconductor layers are provided with respect to each pixel column,
a first edge part of each of the two second semiconductor layers overlaps with the supplementary capacitance line when seen in plan view, and
a second edge part of each of the two second semiconductor layers extends outward from both sides of the supplementary capacitance line in the width direction thereof.

* * * * *